(12) United States Patent
Kim et al.

(10) Patent No.: US 12,160,992 B2
(45) Date of Patent: Dec. 3, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Jiyoung Kim, Hwaseong-si (KR); Bumkyu Kang, Suwon-si (KR); Joonsung Lim, Seongnam-si (KR); Sukkang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/563,547

(22) Filed: Dec. 28, 2021

(65) Prior Publication Data
US 2022/0384476 A1 Dec. 1, 2022

(30) Foreign Application Priority Data
May 26, 2021 (KR) .......................... 10-2021-0067895

(51) Int. Cl.
| | |
|---|---|
| *H10B 43/27* | (2023.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |

(Continued)

(52) U.S. Cl.
CPC ............. *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 41/27; H10B 41/35; H10B 41/40; H10B 43/10; H10B 43/35; H10B 43/40; H10B 43/50; H10B 41/30; H10B 41/50; H10B 43/30; H01L 21/823475; H01L 29/42324; H01L 29/4234; H01L 29/788; H01L 29/792

See application file for complete search history.

(56) References Cited

U.S. PATENT DOCUMENTS

| | | | |
|---|---|---|---|
| 9,099,566 B2 | 8/2015 | Kwon et al. | |
| 9,356,034 B1 * | 5/2016 | Yada | ...................... H10B 41/27 |

(Continued)

FOREIGN PATENT DOCUMENTS

KR 10-2014-0028968 A 3/2014

*Primary Examiner* — David Vu
(74) *Attorney, Agent, or Firm* — Muir Patent Law, PLLC

(57) ABSTRACT

A semiconductor device includes a substrate having a cell region and a connection region, a first stack structure with a plurality of first gate layers and a plurality of first interlayer insulating layers, and a second stack structure with a plurality of second gate layers and a plurality of second interlayer insulating layers. Each of the first gate layers includes a central portion in the cell region of the substrate and an end portion in the connection region of the substrate. Each of the second gate layers includes a central portion in the cell region of the substrate and an end portion in the connection region of the substrate. A thickness difference between the end and central portions of each first gate layer is different from a thickness difference between the end and central portions of each second gate layer.

20 Claims, 40 Drawing Sheets

(51) Int. Cl.
    *H10B 43/35*     (2023.01)
    *H10B 43/40*     (2023.01)

(56) References Cited

U.S. PATENT DOCUMENTS

| | | |
|---|---|---|
| 10,249,640 B2 * | 4/2019 | Yu .................. H01L 23/5283 |
| 10,535,679 B2 | 1/2020 | Baek et al. |
| 10,559,583 B2 | 2/2020 | Park et al. |
| 10,658,374 B2 | 5/2020 | Park et al. |
| 2012/0108048 A1 | 5/2012 | Lim et al. |
| 2019/0043876 A1 | 2/2019 | Van Schravendijk et al. |
| 2020/0365616 A1 | 11/2020 | Baek |
| 2020/0411546 A1 | 12/2020 | Son et al. |
| 2021/0020648 A1 | 1/2021 | Lim et al. |

* cited by examiner

2

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2021-0067895, filed on May 26, 2021, in the Korean Intellectual Property Office, the disclosure of which is incorporated by reference herein in its entirety.

BACKGROUND

1. Field

Embodiments relate to a semiconductor device and an electronic system including the same. In particular, embodiments relate to a three-dimensional (3D) flash memory device and an electronic system including the same.

2. Description of the Related Art

For electronic systems requiring data storage, semiconductor devices storing a large amount of data are demanded. Accordingly, there has been research into increasing the storage capacity of a semiconductor device. For example, to increase the storage capacity of a semiconductor device, 3D flash memory semiconductor devices including memory cells arranged in three dimensions instead of two dimensions have been suggested.

SUMMARY

According to embodiments, there is provided a semiconductor device including a substrate including a cell region and a connection region, a first stack structure including a plurality of first gate layers and a plurality of first interlayer insulating layers, the plurality of first gate layers being stacked on the substrate alternately with the plurality of first interlayer insulating layers one by one in a vertical direction, and a second stack structure including a plurality of second gate layers and a plurality of second interlayer insulating layers, the plurality of second gate layers being stacked on the first stack structure alternately with the plurality of second interlayer insulating layers one by one in the vertical direction, wherein each of the plurality of first gate layers includes a central portion in the cell region of the substrate and an end portion in the connection region of the substrate, each of the plurality of second gate layers includes a central portion in the cell region of the substrate and an end portion in the connection region of the substrate, and a first difference between a thickness of the end portion of each of at least two of the plurality of first gate layers in the vertical direction and a thickness of the central portion of each of the at least two of the plurality of first gate layers in the vertical direction is different from a second difference between a thickness of the end portion of each of at least two of the plurality of second gate layers in the vertical direction and a thickness of the central portion of each of the at least two of the plurality of second gate layers in the vertical direction.

According to another aspect of embodiments, there is provided a semiconductor device including a substrate, a plurality of stack structures stacked on the substrate in a vertical direction, a channel structure passing through the plurality of stack structures in the vertical direction, and a plurality of contacts extending in the vertical direction and being in contact with the plurality of stack structures, wherein the plurality of stack structures include at least one first-type stack structure and at least one second-type stack structure, the at least one first-type stack structure includes a plurality of first gate layers and a plurality of first interlayer insulating layers, the plurality of first gate layers being stacked alternately with the plurality of first interlayer insulating layers one by one in the vertical direction, and the at least one second-type stack structure includes a plurality of second gate layers and a plurality of second interlayer insulating layers, the plurality of second gate layers being stacked alternately with the plurality of second interlayer insulating layers one by one in the vertical direction, wherein each of at least one of the plurality of first gate layers includes a first shaped gate layer having a first shape and including a central portion and an end portion, the central portion being adjacent to the channel structure, and the end portion being adjacent to one of the plurality of contacts that is in contact the first shaped gate layer, and a thickness of the end portion of the first shaped gate layer is greater in the vertical direction than a thickness of the central portion of the first shaped gate layer, and each of the plurality of second gate layers includes a second shaped gate layer having a second shape and including a central portion and an end portion, the central portion being adjacent to the channel structure, and the end portion being adjacent to one of the plurality of contacts that is in contact with the second shaped gate layer, and a thickness of the end portion of the second shaped gate layer is, in the vertical direction, equal to a thickness of the central portion of the second shaped gate layer.

According to a further aspect of embodiments, there is provided an electronic system including a semiconductor device and a controller electrically connected to the semiconductor device, wherein the semiconductor device includes a peripheral circuit structure, a substrate on the peripheral circuit structure, a common source line plate on the substrate, a first stack structure including a plurality of first gate layers and a plurality of first interlayer insulating layers, the plurality of first gate layers being stacked on the common source line plate alternately with the plurality of first interlayer insulating layers one by one in a vertical direction, a second stack structure including a plurality of second gate layers and a plurality of second interlayer insulating layers, the plurality of second gate layers being stacked on the first stack structure alternately with the plurality of second interlayer insulating layers one by one in the vertical direction, a channel structure passing through the common source line plate, the first stack structure, and the second stack structure in the vertical direction, a plurality of first contacts extending in the vertical direction and being respectively in contact with the plurality of first gate layers, and a plurality of second contacts extending in the vertical direction and being respectively in contact with the plurality of second gate layers, wherein each of at least one of the plurality of first gate layers includes a central portion and an end portion, the central portion being adjacent to the channel structure, and the end portion being adjacent to one of the plurality of first contacts respectively contacting the at least one of the plurality of first gate layers, and a thickness of the end portion of each of the at least one of the plurality of first gate layers is greater in the vertical direction than a thickness of the central portion of each of the at least one of the plurality of first gate layers, wherein each of the plurality of second gate layers includes a central portion and an end portion, the central portion being adjacent to the channel structure, and the end portion being adjacent to one of the plurality of second contacts respectively contacting the plurality of second gate layers, and a thickness of the end portion of each of the plurality of second gate layers is less in the vertical direction than the thickness of the end portion of each of the at least one of the plurality of first gate layers.

BRIEF DESCRIPTION OF THE DRAWINGS

Features will become apparent to those of skill in the art by describing in detail exemplary embodiments with reference to the attached drawings, in which.

DETAILED DESCRIPTION OF THE EMBODIMENTS

Figure 1A:
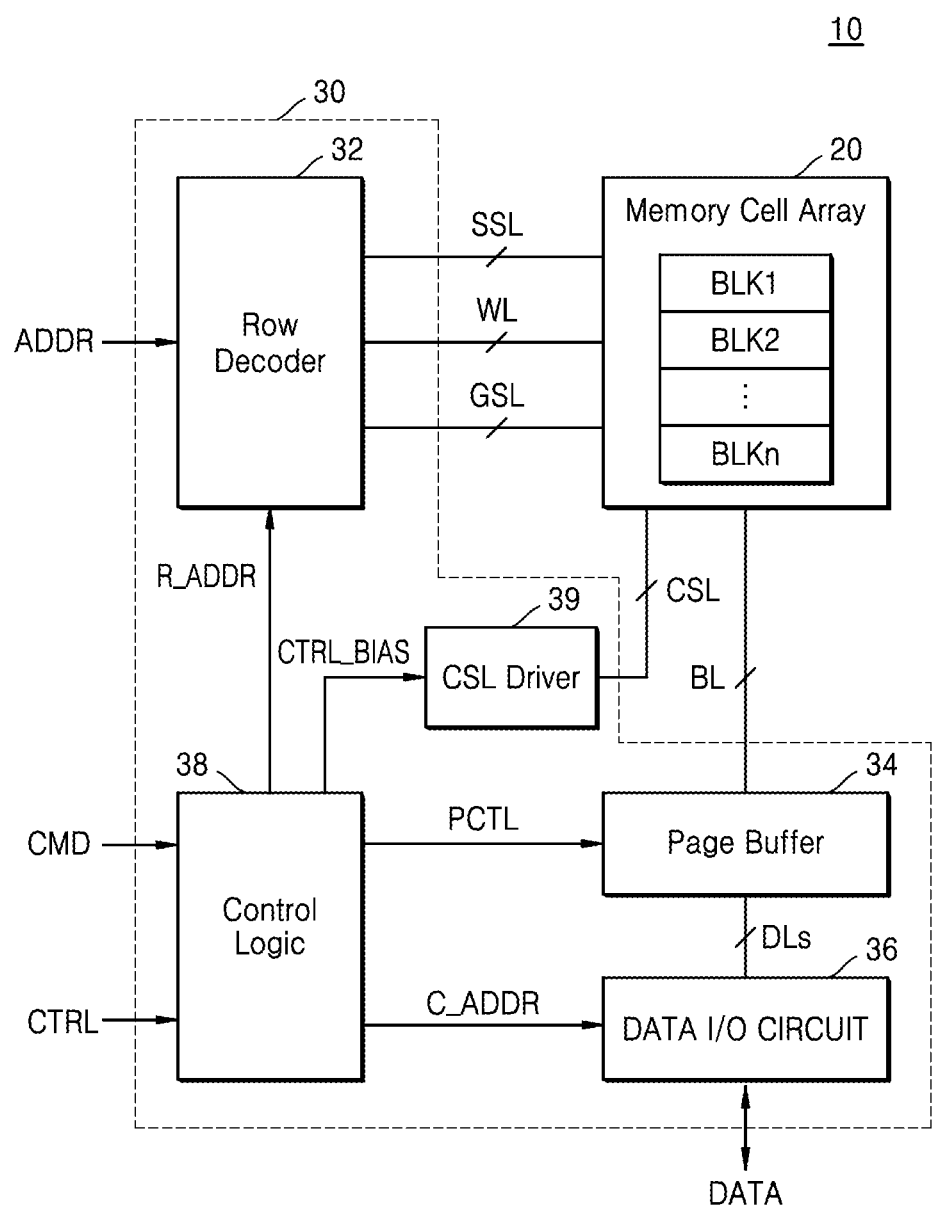
FIG. 1A is a block diagram of a semiconductor device according to embodiments.

FIG. 1A is a block diagram of a semiconductor device 10 according to embodiments.

Referring to FIG. 1A, the semiconductor device 10 may include a memory cell array 20 and a peripheral circuit 30. The peripheral circuit 30 may include a row decoder 32, a page buffer 34, a data input/output (I/O) circuit 36, a control logic 38, and a common source line (CSL) driver 39. Although not shown in FIG. 1A, the peripheral circuit 30 may further include various circuits, e.g., a voltage generation circuit, generating various voltages necessary for the operation of the semiconductor device 10, an error correction circuit correcting an error in data read from the memory cell array 20, and an I/O interface.

The memory cell array 20 may be connected to the page buffer 34 through bit lines BL and to the row decoder 32 through word lines WL, string selection lines SSL, and ground selection lines GSL. The memory cell array 20 may include a plurality of memory cell blocks BLK1, BLK2, . . . , and BLKn. Each of the memory cell blocks BLK1 through BLKn may include a plurality of memory cells. The memory cells may include flash memory cells. The detailed structure of each of the memory cell blocks BLK1 through BLKn will be described with reference to FIG. 1B below.

The row decoder 32 may select at least one of the memory cell blocks BLK1 through BLKn in response to an address ADDR received from the outside and select a word line WL, a string selection line SSL, and a ground selection line GSL, which correspond to the selected memory cell block. The row decoder 32 may transmit a voltage for a memory operation to the word line WL of the selected memory cell block.

The page buffer 34 may be connected to the memory cell array 20 through the bit lines BL. The page buffer 34 may operate as a write driver and apply a voltage, which corresponds to data DATA to be stored in the memory cell array 20, to a bit line BL in a program operation. The page buffer 34 may operate as a sense amplifier and detect the data DATA, which has been stored in the memory cell array 20, in a read operation. The page buffer 34 may operate according to a control signal PCTL provided from the control logic 38.

The data I/O circuit 36 may be connected to the page buffer 34 through a plurality of data lines DLs. In a program operation, the data I/O circuit 36 may receive the data DATA from a memory controller and provide the data DATA to be programmed to the page buffer 34 based on a column address C_ADDR provided from the control logic 38. In a read operation, the data I/O circuit 36 may provide the data DATA, which is stored in the page buffer 34, to the memory controller based on the column address C_ADDR provided from the control logic 38.

The data I/O circuit 36 may transmit an input address or instruction to the control logic 38 or the row decoder 32. The peripheral circuit 30 may further include an electrostatic discharge (ESD) circuit and a pull-up/pull-down driver.

The control logic 38 may receive a command CMD and a control signal CTRL from the memory controller. The control logic 38 may provide a row address R_ADDR to the row decoder 32 and the column address C_ADDR to the data I/O circuit 36. The control logic 38 may generate various internal control signals used in the semiconductor device 10 in response to the control signal CTRL. For example, the control logic 38 may control the levels of voltages applied to a word line WL and a bit line BL during a memory operation, e.g., a program operation or an erase operation.

The CSL driver 39 may be connected to the memory cell array 20 through a common source line CSL. The CSL driver 39 may apply a common source voltage (e.g., a power supply voltage) or a ground voltage to the common source line CSL based on a control signal CTRL_BIAS of the control logic 38.

Figure 1B:
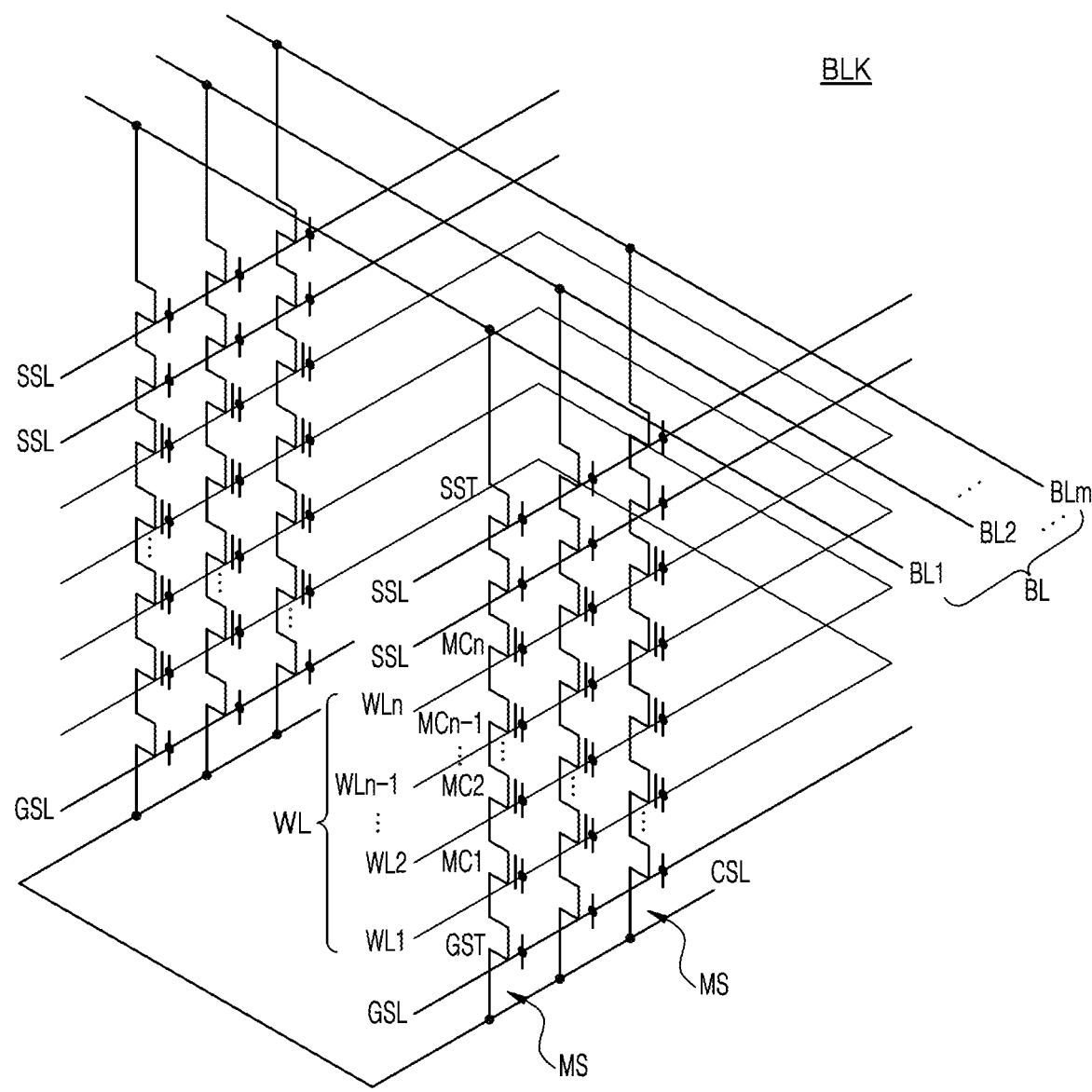
FIG. 1B is an equivalent circuit diagram of a block of a memory cell array of a semiconductor device according to embodiments.

FIG. 1B is an equivalent circuit diagram of a block BLK of a memory cell array of a semiconductor device, according to embodiments.

Referring to FIG. 1B, the block BLK may include a plurality of memory cell strings MS between the common source line CSL and a plurality of bit lines BL, i.e., BL1, BL2, . . . , and BLm. Although the block BLK includes six memory cell strings MS in FIG. 1B, the number of memory cell strings MS included in the block BLK is not limited to six.

Each of the memory cell strings MS may include at least one string selection transistor SST connected to one of the bit lines BL1 through BLm, at least one ground selection transistor GST connected to the common source line CSL, and a plurality of memory cell transistors MC1, MC2, . . . , MCn-1, and MCn between the string selection transistor SST and the ground selection transistor GST. Although each memory cell string MS includes one ground selection transistor GST and two string selection transistors SST in FIG. 1B, the numbers of ground selection transistors GST and string selection transistors SST included in the memory cell string MS are not respectively limited to one and two.

A gate of the string selection transistor SST may be connected to a string selection line SSL. A gate of the ground selection transistor GST may be connected to a ground selection line GSL. Respective gates of the memory cell transistors MC1 through MCn may be respectively connected to a plurality of word lines WL, i.e., WL1, WL2, WLn-1, and WLn.

Figure 2:
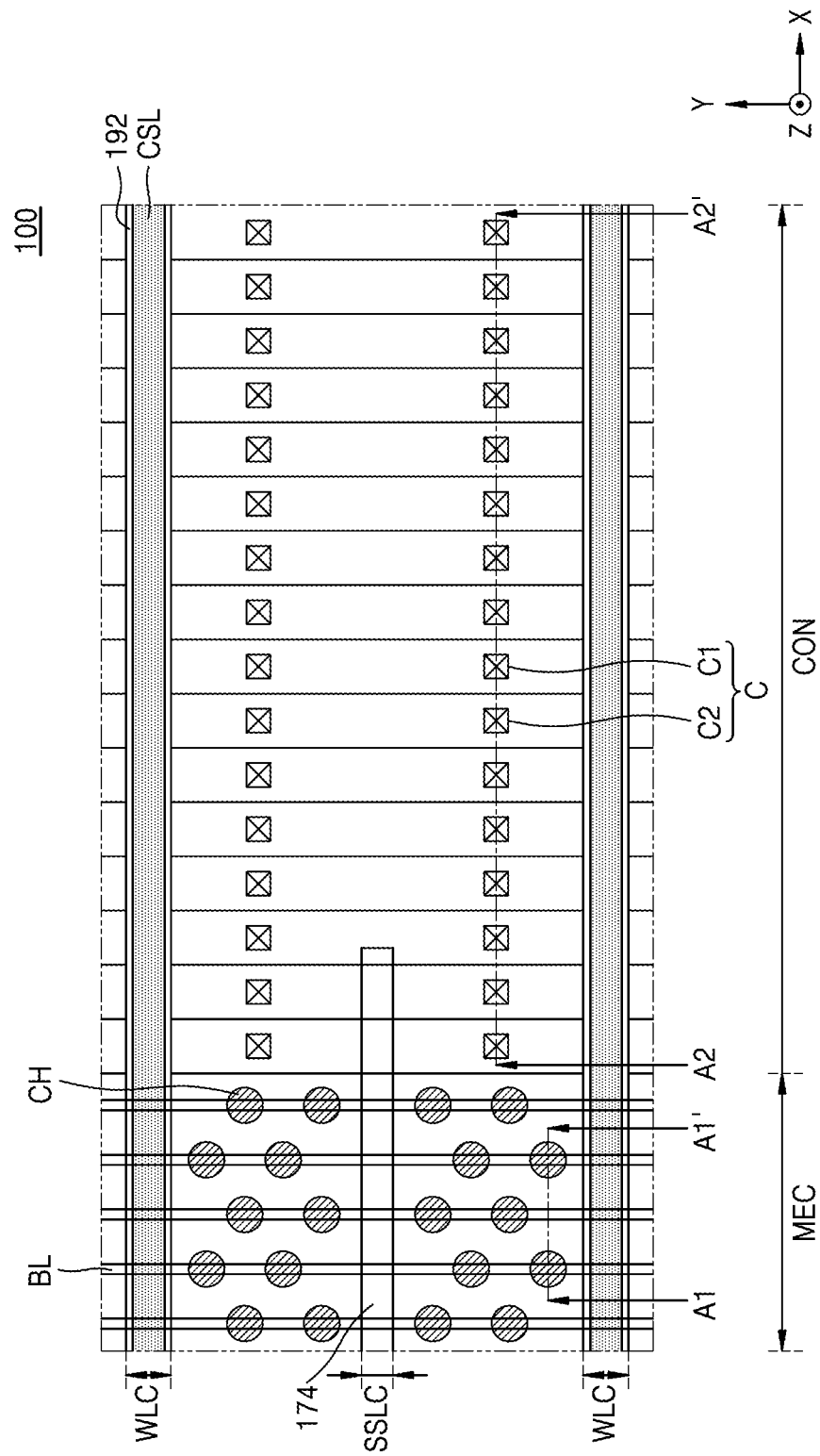
FIG. 2 is a plan view of a semiconductor device according to embodiments.
Figure 3:
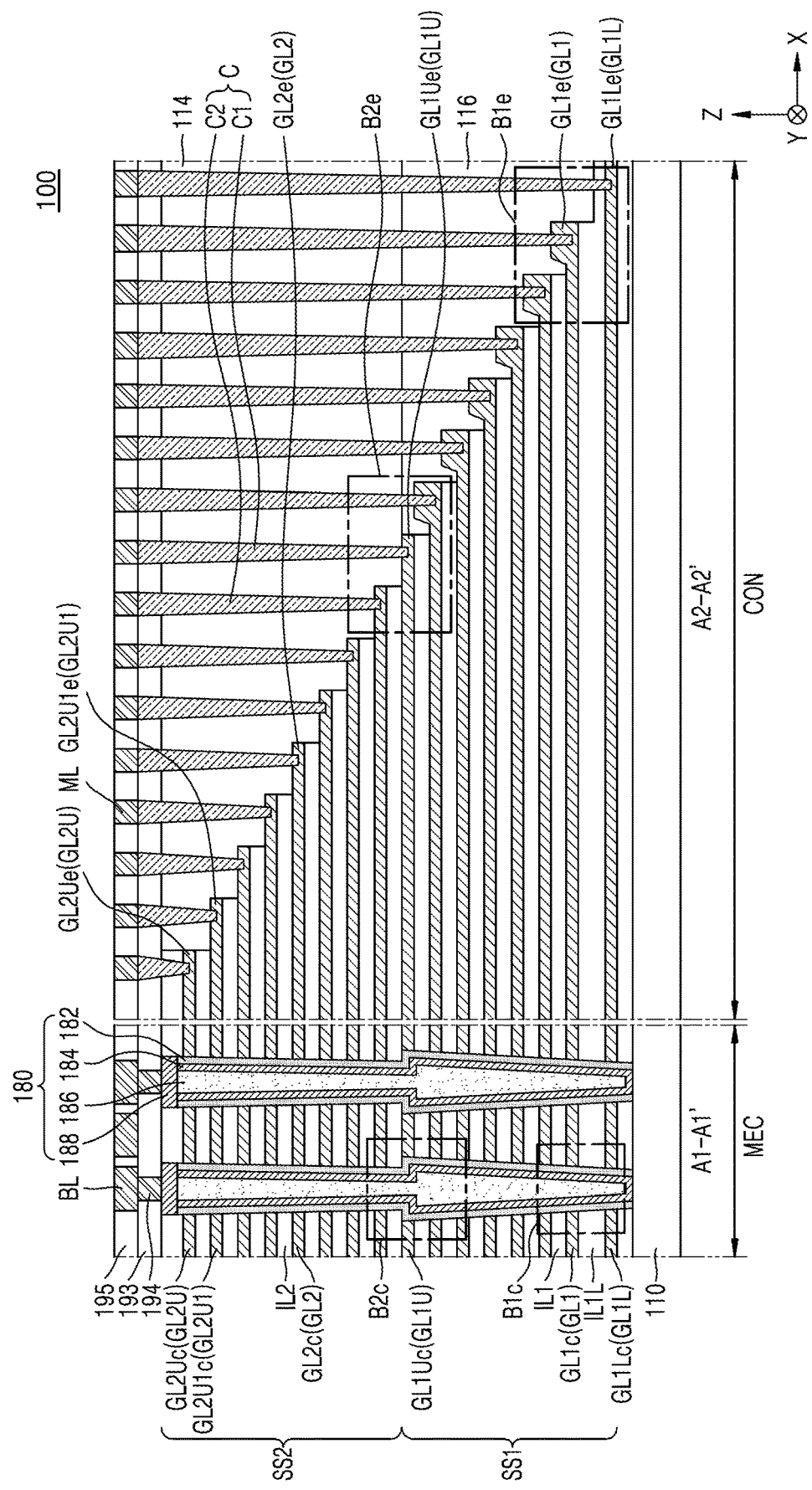
FIG. 3 is a cross-sectional view along lines A1-A1' and A2-A2' in FIG. 2, according to embodiments.
Figure 4A:
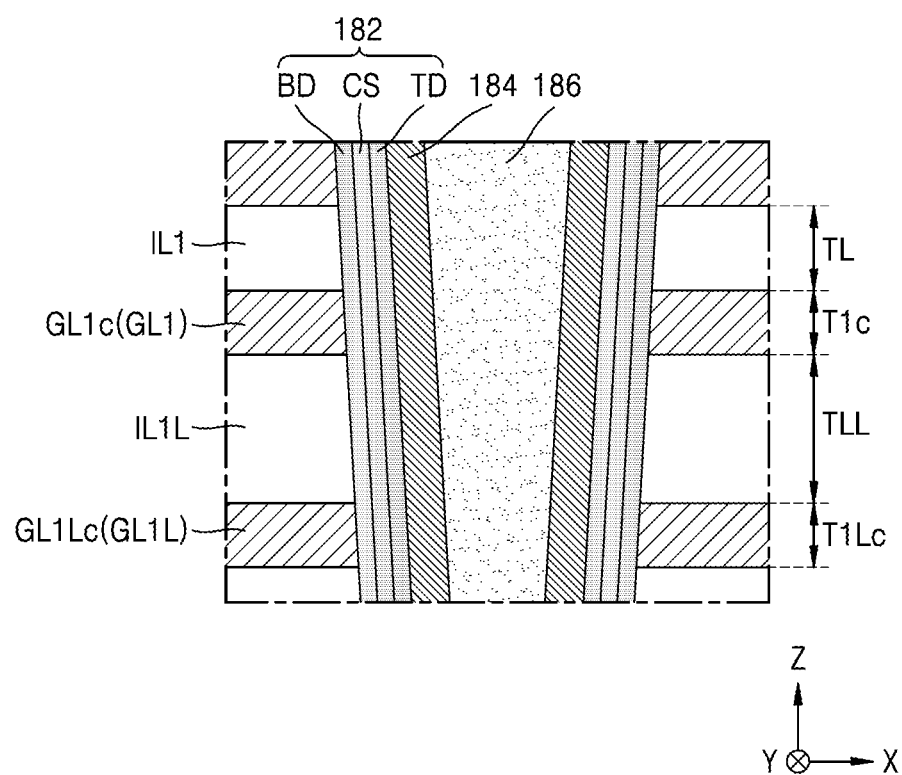
FIG. 4A is an enlarged view of region B1c in FIG. 3.
Figure 4B:
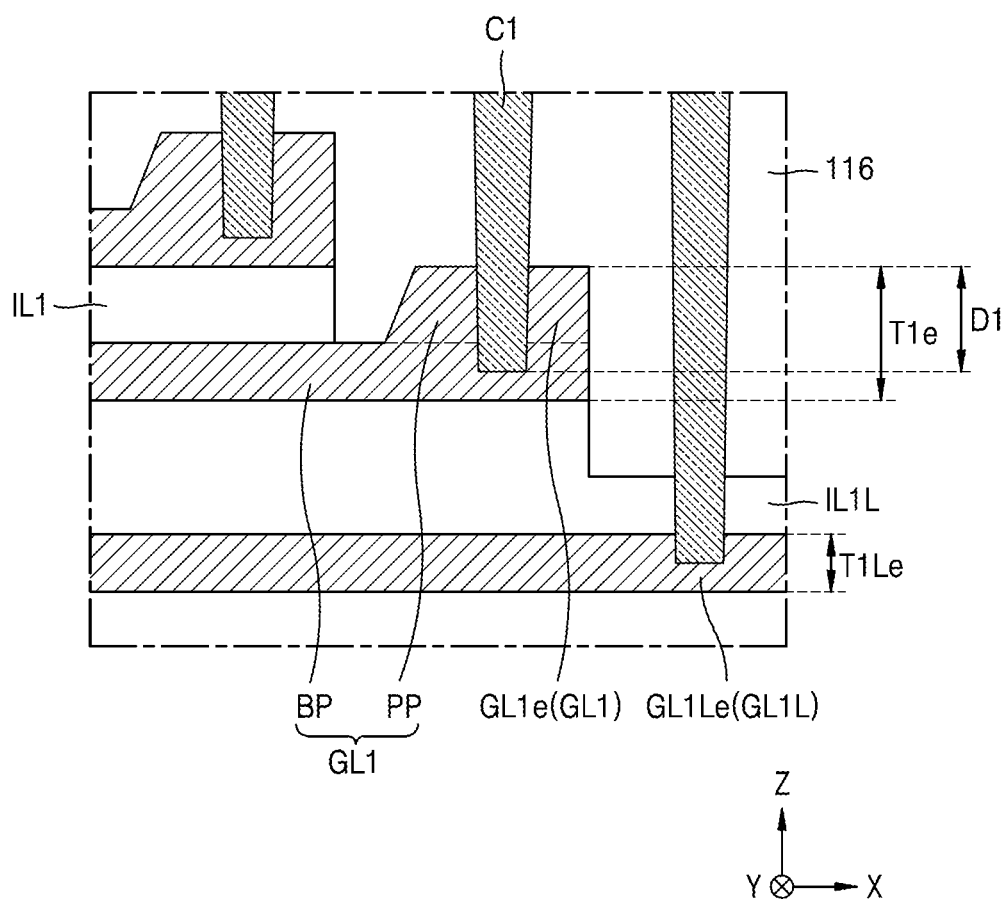
FIG. 4B is an enlarged view of region B1e in FIG. 3.
Figure 4C:
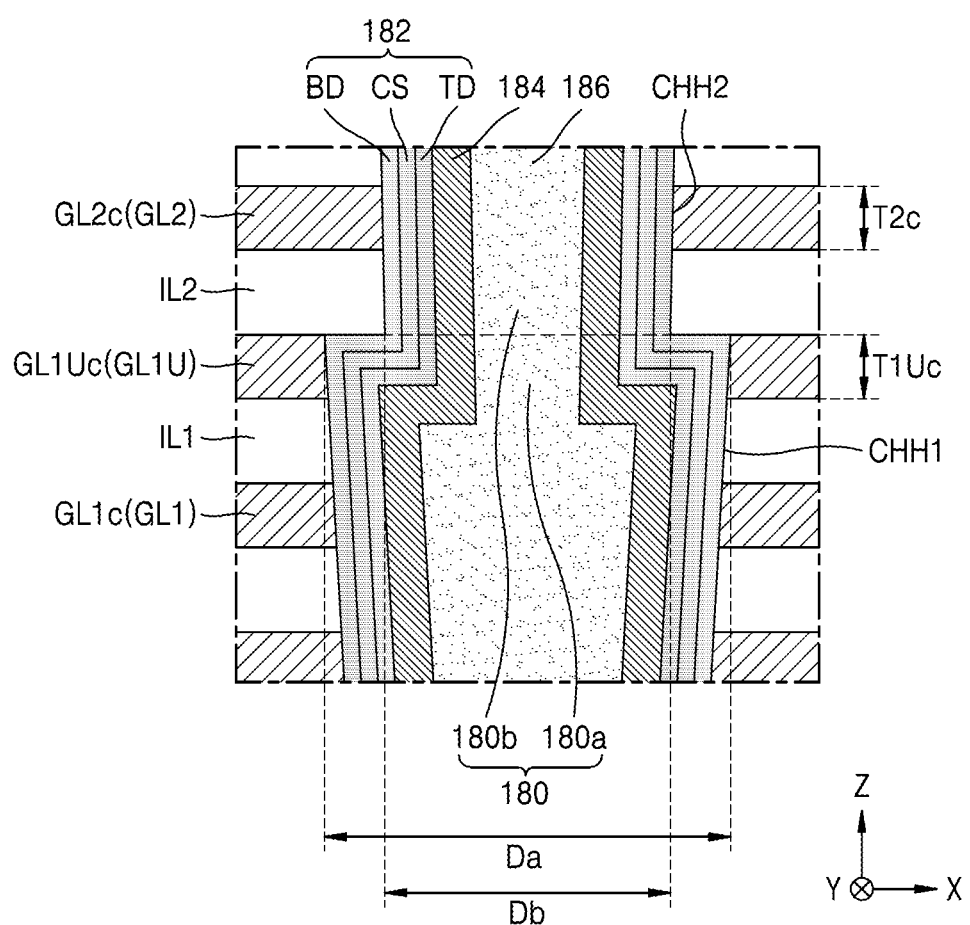
FIG. 4C is an enlarged view of region B2c in FIG. 3.
Figure 4D:
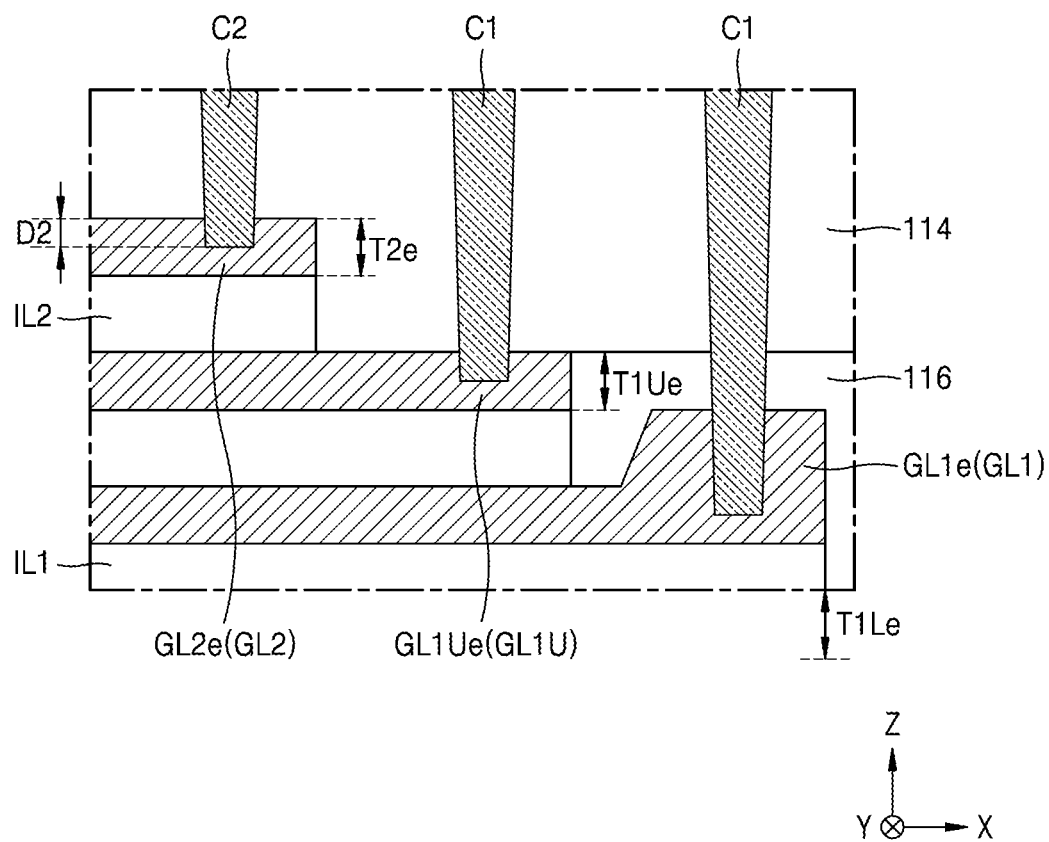
FIG. 4D is an enlarged view of region B2e in FIG. 3.
Figure 5:
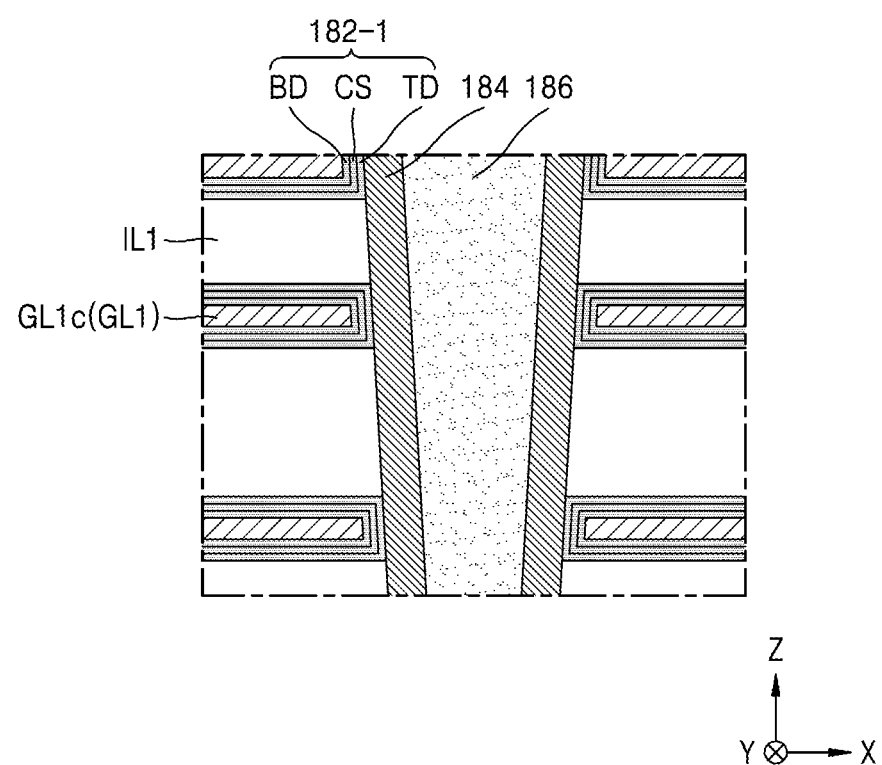
FIG. 5 illustrates a modification of the region B1c in FIG. 3.

FIG. 2 is a plan view of a semiconductor device 100 according to embodiments. FIG. 3 is a cross-sectional view of the semiconductor device 100 along lines A1-A1' and A2-A2' in FIG. 2, according to embodiments. FIG. 4A is an enlarged view of a region B1c in FIG. 3. FIG. 4B is an enlarged view of a region B1e in FIG. 3. FIG. 4C is an enlarged view of a region B2c in FIG. 3. FIG. 4D is an enlarged view of a region B2e in FIG. 3. FIG. 5 illustrates a modification of the region B1c in FIG. 3.

Referring to FIGS. 2 through 5, the semiconductor device 100 may include a substrate 110, which includes a memory cell region MEC and a connection region CON. The substrate 110 may include a semiconductor material, e.g., silicon (Si), germanium (Ge), or a combination thereof. Although the connection region CON is provided at a side of the memory cell region MEC in FIG. 2, two connection regions CON may be respectively provided at both sides of the memory cell region MEC to be separate from each other in a first horizontal direction (e.g., an X direction).

The semiconductor device 100 may further include a first stack structure SS1 on the memory cell region MEC and the connection region CON of the substrate 110 and a second stack structure SS2 on the first stack structure SS1. Portions of the first and second stack structures SS1 and SS2 in the connection region CON of the substrate 110 may have a step structure.

The first stack structure SS1 may include a plurality of first gate layers GL1 and a plurality of first interlayer insulating layers IL1, which are alternately stacked on the connection region CON and the memory cell region MEC of the substrate 110. The second stack structure SS2 may include a plurality of second gate layers GL2 and a plurality of second interlayer insulating layers IL2, which are alternately stacked on the first stack structure SS1. Although it is illustrated in FIG. 3 that the first stack structure SS1 includes eight first gate layers GL1 and eight first interlayer insulating layers IL1 and the second stack structure SS2 includes eight second gate layers GL2 and nine second interlayer insulating layers IL2, the numbers of the first gate layers GL1 and the first interlayer insulating layers IL1 included in the first stack structure SS1 and the numbers of the second gate layers GL2 and the second interlayer insulating layers IL2 included in the second stack structure SS2 are not limited thereto.

The first gate layers GL1 and the second gate layers GL2 may include a conductive material, e.g., tungsten (W), nickel (Ni), cobalt (Co), tantalum (Ta), tungsten nitride (WN), titanium nitride (TiN), tantalum nitride (TaN), or a combination thereof. The first interlayer insulating layers IL1 and the second interlayer insulating layers IL2 may include silicon oxide ($SiO_2$), silicon nitride (SiN), or a combination thereof.

The semiconductor device 100 may further include a channel structure 180 formed on the memory cell region MEC of the substrate 110 to pass through the first stack structure SS1 and the second stack structure SS2 substantially in a vertical direction (e.g., a Z direction). The expression "substantially in the vertical direction (the Z direction)" used herein refers to being designed in the vertical direction (the Z direction), i.e., a direction normal to a bottom of the substrate 110, and may tolerate a tilt, e.g., of about −10 degrees to about +10 degrees, caused by a process error.

The channel structure 180 may include a gate dielectric layer 182, a channel layer 184, a buried insulating layer 186, and a pad 188. The channel layer 184 may be in contact with the substrate 110 and pass through the first stack structure SS1 and the second stack structure SS2. In some embodiments, an epitaxially grown semiconductor layer may be further provided between the substrate 110 and the channel layer 184. The channel layer 184 may have a hollow cylindrical shape. The channel layer 184 may include polysilicon. A space surrounded by the channel layer 184 may be filled with the buried insulating layer 186. For example, the buried insulating layer 186 may include an insulating material, e.g., silicon oxide, silicon nitride, or a combination thereof. In some embodiments, the buried insulating layer 186 may be omitted. In this case, the channel layer 184 may have a pillar shape. The pad 188 may be on the buried insulating layer 186 and in contact with the channel layer 184. The pad 188 may include, e.g., a polysilicon, metal, metal nitride, or a combination thereof. The metal may include, e.g., tungsten, nickel, cobalt, or tantalum.

As shown in FIGS. 3, 4A, and 4C, the gate dielectric layer 182 may extend between the channel layer 184 and the first stack structure SS1 and between the channel layer 184 and the second stack structure SS2. In other words, the gate dielectric layer 182 may extend between the channel layer 184 and the first gate layers GL1, between the channel layer 184 and the first interlayer insulating layers IL1, between the channel layer 184 and the second gate layers GL2, and between the channel layer 184 and the second interlayer insulating layers IL2. The gate dielectric layer 182 may include a tunneling dielectric layer TD on the channel layer 184, a charge storage layer CS on the tunneling dielectric layer TD, and a blocking dielectric layer BD on the charge storage layer CS.

The tunneling dielectric layer TD may include, e.g., silicon oxide ($SiO_2$), hafnium oxide ($HfO_2$), aluminum oxide ($Al_2O_3$), zirconium oxide ($ZrO_2$), tantalum oxide ($Ta_2O_5$), or a combination thereof. The charge storage layer CS may include, e.g., silicon nitride (SiN), boron nitride (BN), or polysilicon. The blocking dielectric layer BD may include, e.g., silicon oxide ($SiO_2$), silicon nitride (SiN), hafnium oxide ($HfO_2$), aluminum oxide ($Al_2O_3$), zirconium oxide ($ZrO_2$), tantalum oxide ($Ta_2O_5$), or a combination thereof.

As shown in FIG. 5 illustrating a modification of the region B1c in FIG. 5, a gate dielectric layer 182-1 may extend between a first gate layer GL1 and the channel layer 184 and between the first gate layer GL1 and a first interlayer insulating layer IL1. Although not shown, the gate dielectric layer 182-1 may also extend between a second gate layer GL2 and the channel layer 184 and the second gate layer GL2 and a second interlayer insulating layer IL2.

Although not shown, at least one of the tunneling dielectric layer TD, the charge storage layer CS, and the blocking dielectric layer BD may extend between the channel layer 184 and a first gate layer GL1, between the first gate layer GL1 and a first interlayer insulating layer IL1, the channel layer 184 and a second gate layer GL2, and between the second gate layer GL2 and a second interlayer insulating layer IL2. The others of the tunneling dielectric layer TD, the charge storage layer CS, and the blocking dielectric layer BD may extend between the channel layer 184 and the first gate layer GL1, between the channel layer 184 and the first interlayer insulating layer IL1, between the channel layer 184 and the second gate layer GL2, and between the channel layer 184 and the second interlayer insulating layer IL2.

As shown in FIGS. 3 and 4C, the channel structure 180 may include a first portion 180a, which passes through the first stack structure SS1, and a second portion 180b, which passes through the second stack structure SS2. A diameter Da of the top of the first portion 180a of the channel structure 180 may be greater than a diameter Db of the bottom of the second portion 180b of the channel structure 180.

The channel structure 180, central portions GL1c of the plurality of first gate layers GL1, and central portions GL2c of the plurality of second gate layers GL2 may form a memory cell string MS in FIG. 1B. For example, the channel structure 180 and a central portion GL1Lc of a lowest first gate layer GL1L among the first gate layers GL1 may form a ground selection transistor GST in FIG. 1B. An end portion GL1Le of the lowest first gate layer GL1L among the first gate layers GL1 may function as a ground selection line GSL in FIG. 1B.

The channel structure 180 and each of respective central portions GL2Uc and GL2U1c of two uppermost second gate layers GL2U and GL2U1 among the second gate layers GL2 may form a string selection transistor SST in FIG. 1B. Each of respective end portions GL2Ue and GL2U1e of the two uppermost second gate layers GL2U and GL2U1 among the second gate layers GL2 may function as a string selection line SSL in FIG. 1B. As shown in FIGS. 2 and 3, each of the respective end portions GL2Ue and GL2U1e of the two uppermost second gate layers GL2U and GL2U1 may be divided into two portions by a string selection line cut SSLC. The string selection line cut SSLC may be filled with a string selection line cut insulating layer 174. The string selection line cut insulating layer 174 may include an insulating material, e.g., silicon oxide, silicon nitride, or a combination thereof.

End portions GL1e of the first gate layers GL1 except for the lowest first gate layer GL1L and end portions GL2e of the second gate layers GL2 except for the two uppermost second gate layers GL2U and GL2U1 may respectively function as the word lines WL in FIG. 1B.

A bit line BL may extend in a second horizontal direction (e.g., a Y direction). The bit line BL may be connected to the channel structure 180 through a bit line contact pad 194. The bit line contact pad 194 and the bit line BL may include, e.g., tungsten (W), titanium (Ti), tantalum (Ta), copper (Cu), aluminum (Al), titanium nitride (TiN), tantalum nitride (TaN), tungsten nitride (WN), or a combination thereof.

A word line cut WLC may extend in the first horizontal direction (the X direction). Although not shown in FIGS. 2 and 3, the word line cut WLC may extend to the top of the substrate 110 in the vertical direction (the Z direction). The common source line CSL may extend in the word line cut WLC in the first horizontal direction (the X direction) and the vertical direction (the Z direction). An insulating spacer 192 may be between a side wall of the common source line CSL and an inner side wall of the word line cut WLC. The common source line CSL may include a conductive material, e.g., polysilicon or tungsten (W). The insulating spacer 192 may include an insulating material, e.g., silicon oxide, silicon nitride, or a combination thereof. Unlike the embodiment of FIG. 2, the common source line CSL and the insulating spacer 192 may not be included in the word line cut WLC in an embodiment. Instead, the word line cut WLC may be fully filled with an insulating material.

The semiconductor device 100 may further include a plurality of contacts C. The contacts C may include a plurality of first contacts C1 and a plurality of second contacts C2. The first contacts C1 may extend substantially in the vertical direction (the Z direction) and be respectively in contact with the first gate layers GL1. The second contacts C2 may extend substantially in the vertical direction (the Z direction) and be respectively in contact with the second gate layers GL2. The contacts C may include a conductive material, e.g., copper (Cu), aluminum (Al), or tungsten (W).

Each of the first gate layers GL1 may include a central portion GL1c adjacent to the channel structure 180 and an end portion GL1e adjacent to the first contact C1 contacting each of the first gate layers GL1. The central portion GL1c of a first gate layer GL1 may be in the memory cell region MEC of the substrate 110, and the end portion GL1e of the first gate layer GL1 may be in the connection region CON of the substrate 110.

A plurality of first gate layers GL1 may have a first shape. In detail, as shown in FIGS. 4A and 4B, a thickness T1e of the end portion GL1e of a first gate layer GL1 having the first shape may be greater in the vertical direction (the Z direction) than a thickness T1c of the central portion GL1c of the first gate layer GL1. In other words, as shown in FIGS. 4A and 4B, each of the first gate layers GL1 having the first shape may include a base portion BP extending with the thickness T1c that is constant and a protrusion portion PP protruding from the top of the base portion BP.

In some embodiments, the lowest first gate layer GL1L among the first gate layers GL1 may have a second shape. In detail, as shown in FIGS. 3, 4A, and 4B, a thickness T1Le of the end portion GL1Le of the lowest first gate layer GL1L having the second shape may be substantially the same as a thickness T1Lc of the central portion GL1Lc of the lowest first gate layer GL1L in the vertical direction (the Z direction). Herein, when two thicknesses are substantially the same as each other, it means that the two thicknesses are designed to be the same as each other and that a process error, e.g., an error of about −10% to about +10% may be tolerated. In other words, the lowest first gate layer GL1L having the second shape may not include the protrusion portion PP in FIG. 4B. In some embodiments, the lowest first gate layer GL1L having the second shape may extend in the first horizontal direction (the X direction) with substantially the same, e.g., constant, thickness. In some embodiments, unlike those shown in FIGS. 3, 4A, and 4B, the lowest first gate layer GL1L may have the first shape like most of the others of the first gate layers GL1.

When the lowest first gate layer GL1L among the first gate layers GL1 has the second shape, a thickness TLL of a first interlayer insulating layer IL1L on the lowest first gate layer GL1L may be greater in the vertical direction (the Z direction) than a thickness TL of the others of the first interlayer insulating layers IL1, as shown in FIG. 4A. The first interlayer insulating layer IL1L may entirely cover the top surface of the lowest first gate layer GL1L among the first gate layers GL1.

In some embodiments, an uppermost first gate layer GL1U among the first gate layers GL1 may have the second shape. In detail, as shown in FIGS. 3, 4C, and 4D, a thickness T1Ue of an end portion GL1Ue of the uppermost first gate layer GL1U having the second shape may be substantially the same as a thickness T1Uc of a central portion GL1Uc of the uppermost first gate layer GL1U in the vertical direction (the Z direction). In other words, the uppermost first gate layer GL1U having the second shape may not include the protrusion portion PP in FIG. 4B. In some embodiments, the uppermost first gate layer GL1U having the second shape may extend in the first horizontal direction (the X direction) with substantially the same thickness. In some embodiments, unlike those shown in FIGS. 3, 4C, and 4D, the uppermost first gate layer GL1U may have the first shape like most of the others of the first gate layers GL1.

Each of the second gate layers GL2 may include a central portion GL2c adjacent to the channel structure 180 and an end portion GL2e adjacent to a second contact C2 contacting each of the second gate layers GL2. The central portion GL2c of each of the second gate layers GL2 may be in the memory cell region MEC of the substrate 110, and the end portion GL2e of each of the second gate layers GL2 may be in the connection region CON of the substrate 110.

Each of the second gate layers GL2 may have the second shape. In detail, as shown in FIGS. 3, 4C, and 4D, a thickness T2e of the end portion GL2e of each of the second gate layers GL2 having the second shape may be substantially the same as a thickness T2c of the central portion GL2c of each of the second gate layers GL2 in the vertical direction (the Z direction). In other words, each of the second gate layers GL2 having the second shape may not include the protrusion portion PP in FIG. 4B. In some embodiments, each of the second gate layers GL2 having the second shape may extend in the first horizontal direction (the X direction) with substantially the same thickness.

As shown in FIGS. 4B and 4D, the thickness T2e of the end portion GL2e of a second gate layer GL2 having the second shape may be less in the vertical direction (the Z direction) than the thickness T1e of the end portion GL1e of a first gate layers GL1 having the first shape.

Here, a stack structure including at least one gate layer having the first shape (in which an end portion is thicker than a central portion) may be defined as a first-type stack structure. For example, the first stack structure SS1 may be of a first type. A stack structure including gate layers each having the second shape (in which the thickness of an end portion is the same as the thickness of a central portion) may be defined as a second-type stack structure. For example, the second stack structure SS2 may be of a second type.

The likelihood of a punching-through failure, e.g., complete penetration through an entire thickness of a layer, occurring when the first contact C1 contacting the first gate layer GL1 is formed may be higher than the likelihood of a punching-through failure occurring when the second contact C2 contacting the second gate layer GL2 is formed, e.g., due to the depth of the contact holes through the first gate layers GL1. For example, an average of depths D1, by which the first contacts C1 are respectively recessed into the first gate layers GL1 in the vertical direction (the Z direction), may be greater than an average of depths D2, by which the second contacts C2 are respectively recessed into the second gate layers GL2 in the vertical direction (the Z direction), as shown in FIGS. 4B and 4D. In some embodiments, as shown in FIGS. 4A and 4B, the maximum among the depths D1, by which the first contacts C1 are respectively recessed into the first gate layers GL1 in the vertical direction (the Z direction), may be greater than the thickness T1c of the central portion GL1c of each of the first gate layers GL1.

As described above, when the likelihood of a punching-through failure occurring when the first contact C1 contacting the first gate layer GL1 is formed is relatively high, it is possible to reduce the likelihood of the punching-through failure by forming the end portion GL1e of the first gate layer GL1 to be thicker than the central portion GL1c of the first gate layer GL1, and accordingly, the yield of manufacturing processes may be increased. When the likelihood of a punching-through failure occurring when the second contact C2 contacting the second gate layer GL2 is formed is relatively low, a process of forming the end portion GL2e of the second gate layer GL2 to be thicker than the central portion GL2c of the second gate layer GL may be omitted, and accordingly, the cost of manufacturing processes may be decreased. In other words, when the first stack structure SS1 is formed as the first type, the likelihood of a punching-through failure may be decreased and the yield of manufacturing process may be increased. In addition, when the second stack structure SS2 is formed as the second type, the cost of manufacturing processes may be further decreased.

The semiconductor device 100 may further include a first insulating layer 116 and a second insulating layer 114. The first insulating layer 116 may be formed on the connection region CON of the substrate 110 to cover the step shape of the first stack structure SS1. The first insulating layer 116 may surround the plurality of first contacts C1. The second insulating layer 114 may be formed on the first insulating layer 116 to cover the step shape of the second stack structure SS2. The second insulating layer 114 may surround the plurality of first contacts C1 and the plurality of second contacts C2.

The semiconductor device 100 may further include a third insulating layer 193, the bit line contact pad 194, and a fourth insulating layer 195. The third insulating layer 193 may be on the second stack structure SS2 and the second insulating layer 114. The third insulating layer 193 may surround a plurality of the bit line contact pads 194 and the plurality of contacts C. The fourth insulating layer 195 may be on the third insulating layer 193. The fourth insulating layer 195 may surround the plurality of bit lines BL and a plurality of wiring layers ML. The first insulating layer 116, the second insulating layer 114, the third insulating layer 193, and the fourth insulating layer 195 may include, e.g., silicon oxide, silicon nitride, a low-k dielectric, or a combination thereof.

Figure 6:
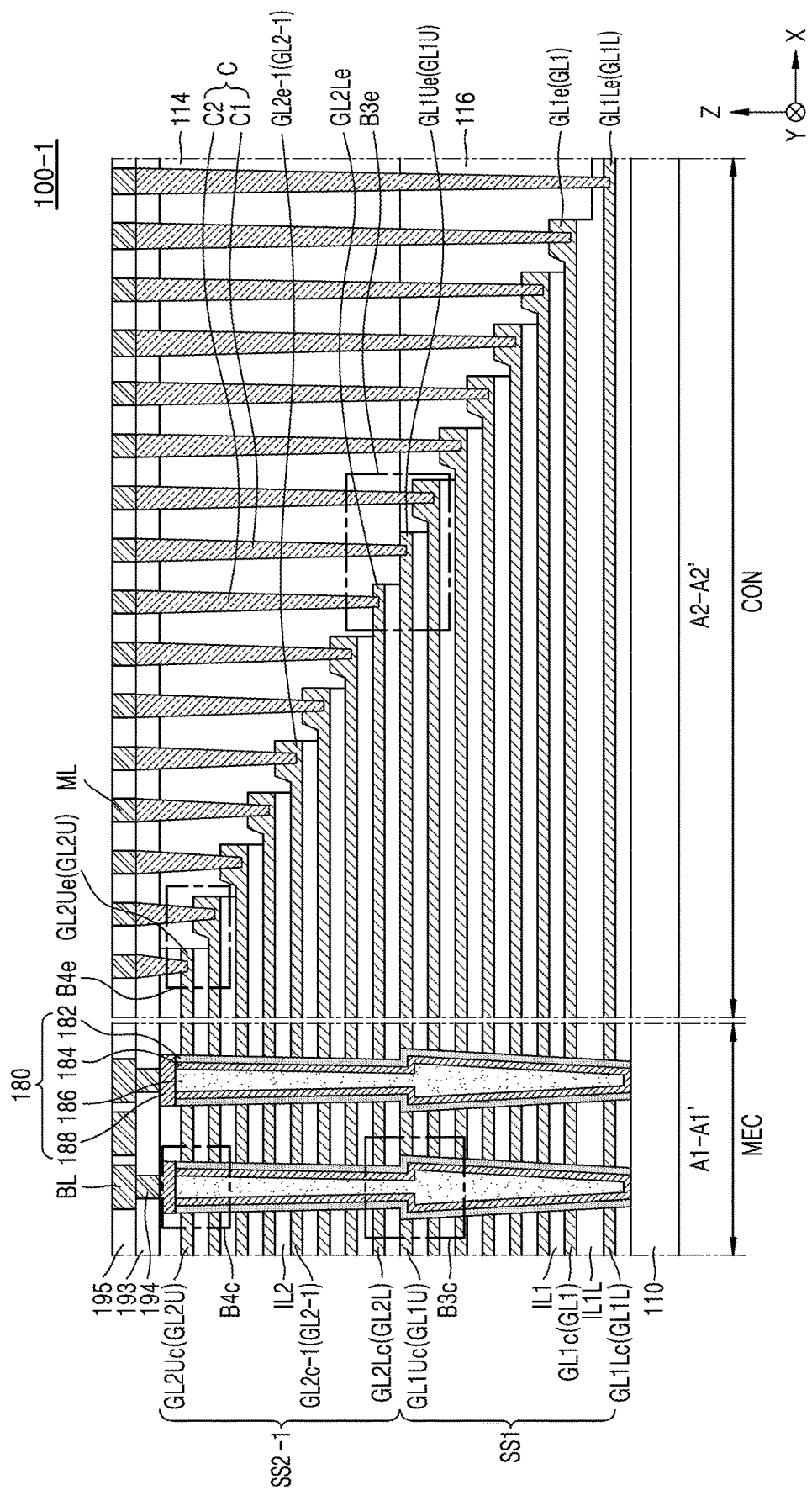
FIG. 6 is a cross-sectional view of a semiconductor device according to embodiments.
Figure 7A:
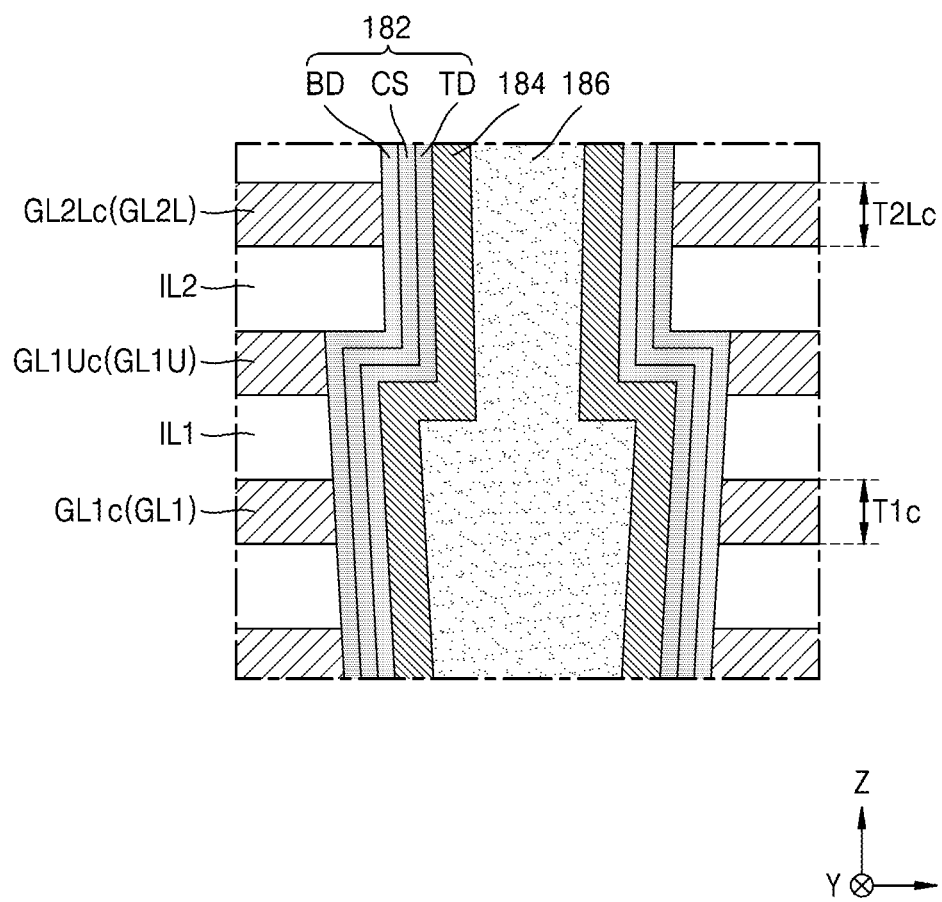
FIG. 7A is an enlarged view of region B3c in FIG. 6.
Figure 7B:
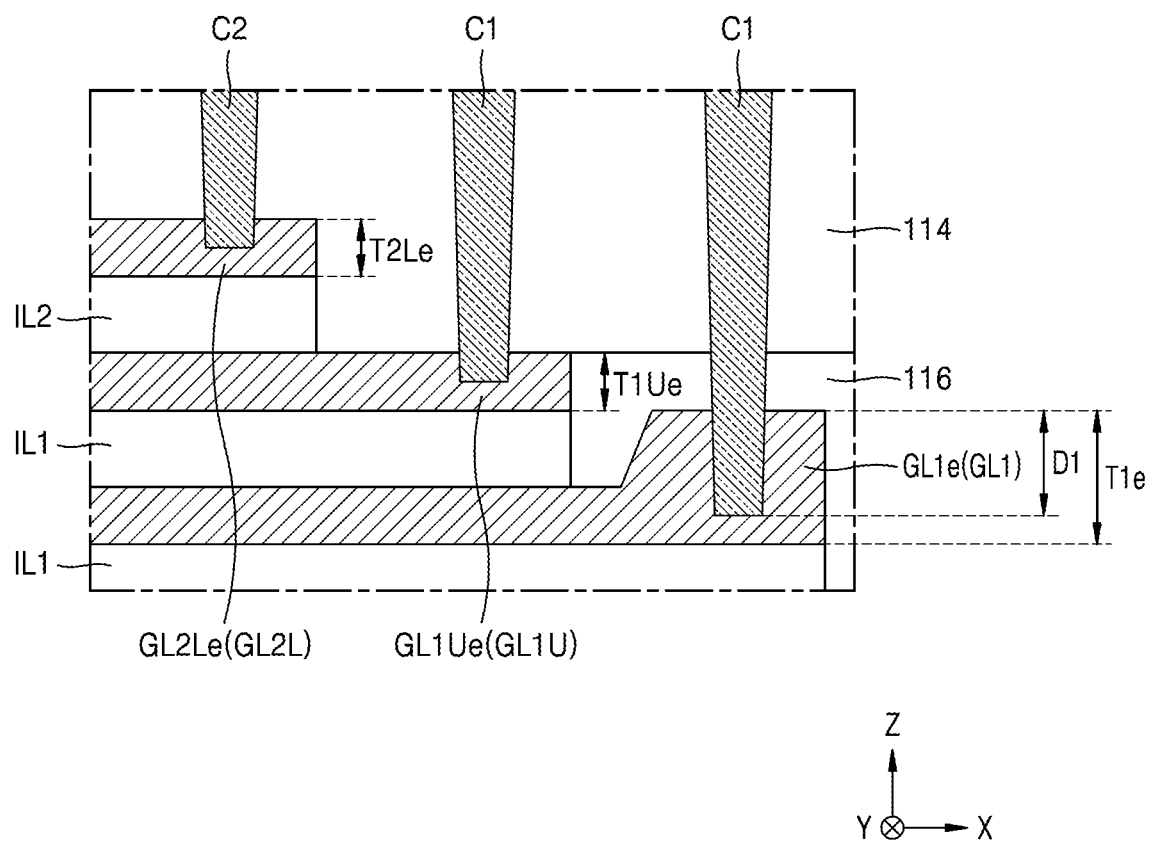
FIG. 7B is an enlarged view of region B3e in FIG. 6.
Figure 7C:
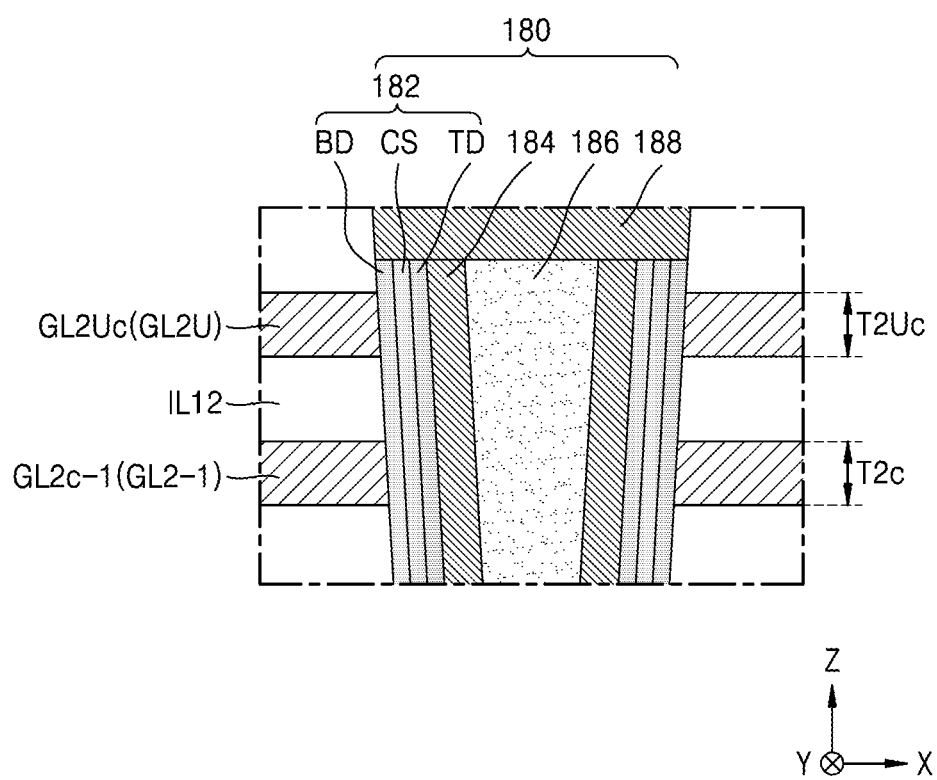
FIG. 7C is an enlarged view of region B4c in FIG. 6.
Figure 7D:
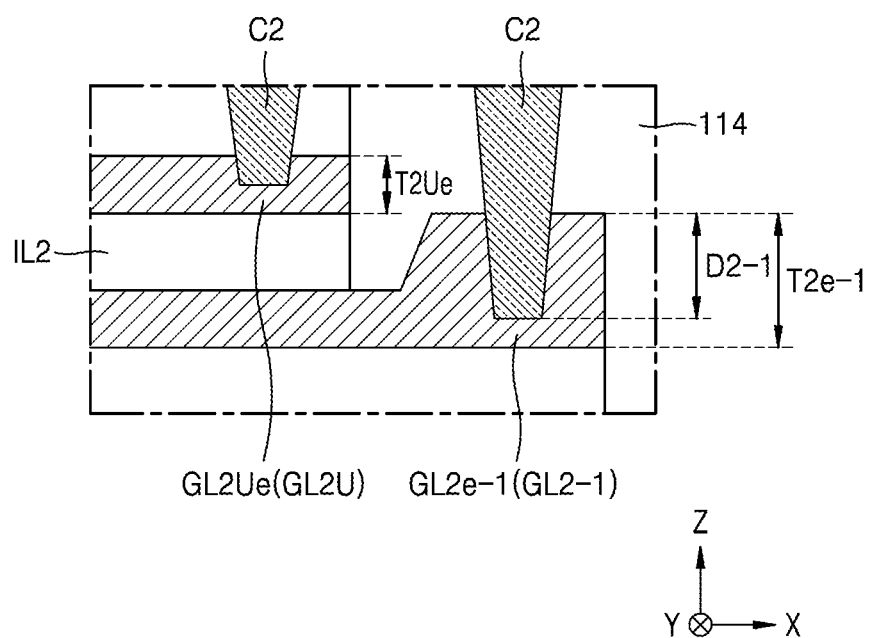
FIG. 7D is an enlarged view of region B4e in FIG. 6.

FIG. 6 is a cross-sectional view of a semiconductor device 100-1 according to embodiments. FIG. 6 shows cross-sectional views respectively taken along lines A1-A1' and A2-A2' in FIG. 2. FIG. 7A is an enlarged view of region B3c in FIG. 6. FIG. 7B is an enlarged view of region B3e in FIG. 6. FIG. 7C is an enlarged view of region B4c in FIG. 6. FIG. 7D is an enlarged view of region B4e in FIG. 6. Hereinafter, differences between the semiconductor device 100 illustrated in FIGS. 2 through 5 and the semiconductor device 100-1 illustrated in FIG. 6 and FIGS. 7A through 7D are described.

Referring to FIG. 6 and FIGS. 7A through 7D, a second stack structure SS2-1 may be of the first type. In other words, the second stack structure SS2-1 may include a plurality of second gate layers GL2-1 having the first shape. That is, as shown in FIGS. 7C and 7C, a thickness T2e-1 of an end portion GL2e-1 of a second gate layer GL2-1 having the first shape may be greater in the vertical direction (the Z direction) than a thickness T2c of a central portion GL2c-1 of the second gate layer GL2-1.

As shown in FIGS. 6 and 7D, the uppermost second gate layer GL2U among the plurality of second gate layers GL2-1 may have the second shape. As shown in FIGS. 7C and 7D, a thickness T2Ue of an end portion GL2Ue of the uppermost second gate layer GL2U having the second shape may be substantially the same as a thickness T2Uc of a central portion GL2Uc of the uppermost second gate layer GL2U in the vertical direction (the Z direction).

As shown in FIGS. 6 and 7B, a lowest second gate layer GL2L among the second gate layers GL2-1 may have the second shape. As shown in FIGS. 7A and 7B, a thickness T2Le of an end portion GL2Le of the lowest second gate layer GL2L having the second shape may be substantially the same as a thickness T2Lc of a central portion GL2Lc of the lowest second gate layer GL2L in the vertical direction (the Z direction).

As shown in FIGS. 7B and 7D, a difference (i.e., (T2e-1)-(T2c)) between the thicknesses T2e-1 and T2c of the end and central portions GL2e-1 and GL2c-1 of a second gate layer GL2-1 having the first shape may be less than a difference (i.e., (T1e)-(Tic)) between the thicknesses T1e and T1c of the end and central portions GL1e and GL1c of a first gate layer GL1 having the first shape. In this case, the likelihood of a punching-through failure occurring when the first contact C1 contacting the first gate layer GL1 is formed may be higher than the likelihood of a punching-through failure occurring when the second contact C2 contacting the second gate layer GL2-1 is formed. For example, the average of the depths D1, by which the first contacts C1 are respectively recessed into the first gate layers GL1 in the vertical direction (the Z direction), may be greater than an average of depths D2-1, by which the second contacts C2 are respectively recessed into the second gate layers GL2-1 in the vertical direction (the Z direction), as shown in FIGS. 7B and 7D.

As described above, when the likelihood of a punching-through failure occurring when the second contact C2 contacting the second gate layer GL2-1 is formed is relatively low, the end portion GL2e-1 of the second gate layer GL2-1 may be formed to be thicker than the central portion GL2c-1 of the second gate layer GL2-1 but to be thinner than the end portion GL1e of the first gate layer GL1.

Further, when the likelihood of a punching-through failure occurring when the second contact C2 contacting the second gate layer GL2-1 is formed is relatively high, the end portion GL2e-1 of the second gate layer GL2-1 may be formed to be thicker than the central portion GL2c-1 of the second gate layer GL2-1 and the end portion GL1e of the first gate layer GL1. In other words, unlike those illustrated in FIGS. 7B and 7D, the difference (i.e., (T2e-1)-(T2c)) between the thicknesses T2e-1 and T2c of the end and central portions GL2e-1 and GL2c-1 of the second gate layer GL2-1 having the first shape may be greater than the difference (i.e., (T1e)-(T1c)) between the thicknesses T1e and T1c of the end and central portions GL1e and GL1c of the first gate layer GL1 having the first shape.

Figure 8A:
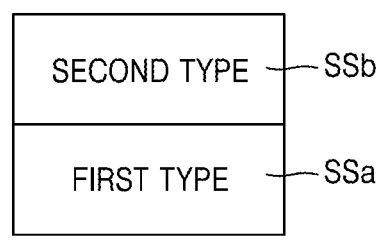
FIGS. 8A through 8C are conceptual diagrams of semiconductor devices according to embodiments.
Figure 8B:
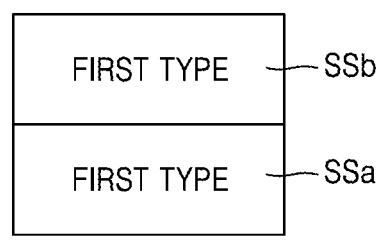
Figure 8C:
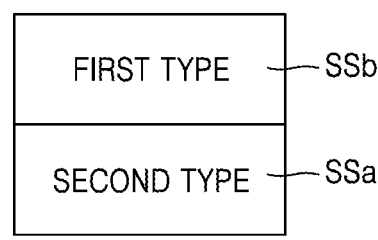

FIGS. 8A through 8C are respectively conceptual diagrams of semiconductor devices 100, 100-1, and 100-2 according to embodiments.

FIG. 8A schematically illustrates the semiconductor device 100 described above with reference to FIGS. 2 through 5. As described above with reference to FIGS. 2 and 5, the semiconductor device 100 includes a first stack structure SSa of a first type and a second stack structure SSb of a second type on the first stack structure SSa.

FIG. 8B schematically illustrates the semiconductor device 100-1 described above with reference to FIG. 6 and FIGS. 7A through 7D. As described above with reference to FIG. 6 and FIGS. 7A through 7D, the semiconductor device 100-1 includes the first stack structure SSa of the first type and the second stack structure SSb of the first type on the first stack structure SSa.

As shown in FIG. 8C, according to embodiments, a semiconductor device 100-2 includes the first stack structure SSa of the second type and the second stack structure SSb of the first type on the first stack structure SSa.

As shown in FIGS. 8A through 8C, a combination of the type of the first stack structure SSa and the type of the second stack structure SSb may vary. When a stack structure, which has a relatively high likelihood of punching-through failure among a plurality of stack structures, e.g., the first and second stack structures SSa and SSb, is formed as the first type, the likelihood of punching-through failure may be decreased. When a stack structure, which has a relatively low likelihood of punching-through failure among a plurality of stack structures, e.g., the first and second stack structures SSa and SSb, is formed as the second type, the cost of manufacturing processes may be reduced. In general, the uppermost stack structure, i.e., the second stack structure SSb, among a plurality of stack structures, e.g., the first and second stack structures SSa and SSb, has a relatively low likelihood of punching-through failure and may thus be highly likely to be formed as the second type, as shown in FIG. 8A. However, the embodiments of FIGS. 8B and 8C, in which the second stack structure SSb is of the first type, are not excluded.

FIGS. 9A through 9G are respectively conceptual diagrams of semiconductor devices 100-3a through 100-3g according to embodiments.

Figure 9A:
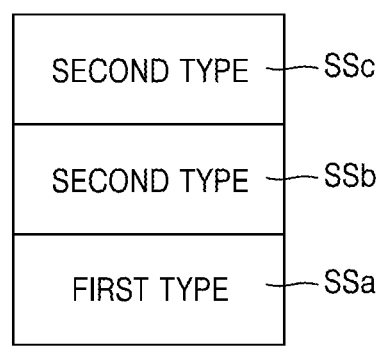
FIGS. 9A through 9G are conceptual diagrams of semiconductor devices according to embodiments.
Figure 9B:
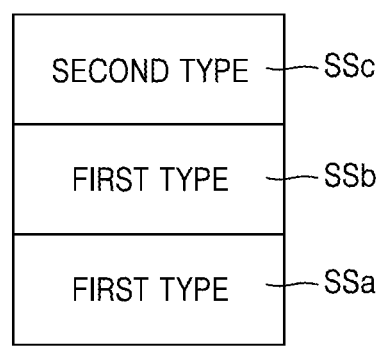
Figure 9C:
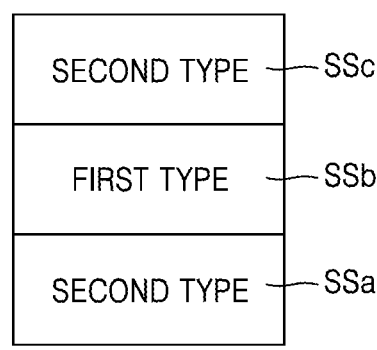
Figure 9D:
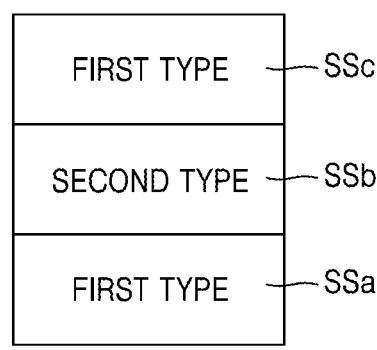
Figure 9E:
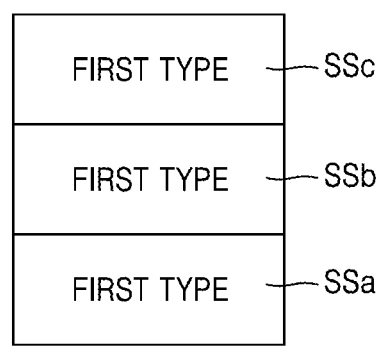
Figure 9F:
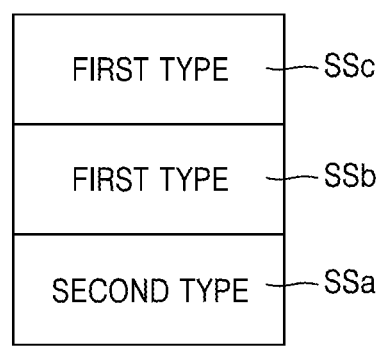
Figure 9G:
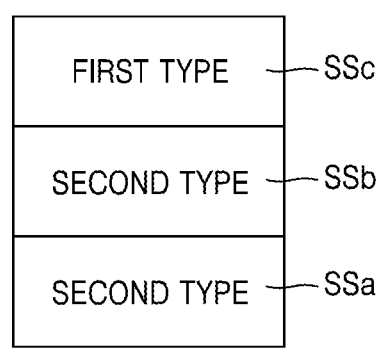

Referring to FIGS. 9A through 9G, a combination of the type of the first stack structure SSa, the type of the second stack structure SSb, and the type of a third stack structure SSc may vary. The uppermost stack structure, i.e., the third stack structure SSc, among a plurality of stack structures, e.g., the first through third stack structures SSa, SSb, and SSc, has a relatively low likelihood of punching-through failure and may thus be highly likely to be formed as the second type, as shown in FIGS. 9A through 9C. However, the embodiments of FIGS. 9D and 9G, in which the third stack structure SSc is of the first type, are not excluded.

The second stack structure SSb between the lowest stack structure, i.e., the first stack structure SSa, and the uppermost stack structure, i.e., the third stack structure SSc, among the first through third stack structures SSa, SSb, and SSc may have a relatively high likelihood of punching-through failure. Accordingly, the second stack structure SSb is highly likely to be of the first type, as shown in FIGS. 9B, 9C, 9E, and 9F. However, the embodiments of FIGS. 9A, 9D, and 9G, in which the second stack structure SSb is of the second type, are not excluded.

Although it is shown in FIGS. 9A through 9G that each of the semiconductor devices 100-3a through 100-3g includes three stack structures, i.e., the first through third stack structures SSa, SSb, and SSc, a semiconductor device may include at least four stack structures.

Figure 10:
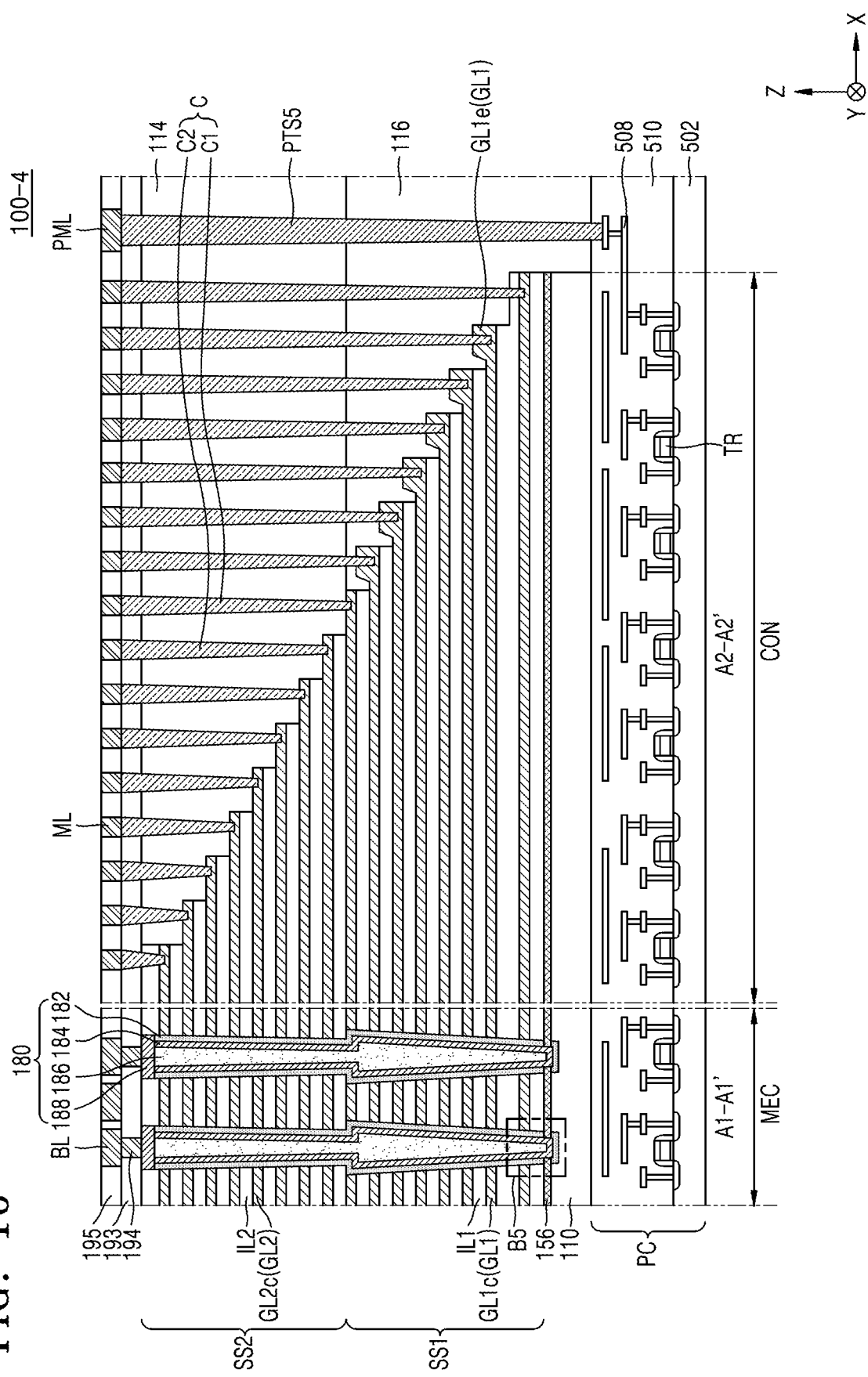
FIG. 10 is a cross-sectional view of a semiconductor device according to embodiments.
Figure 11:
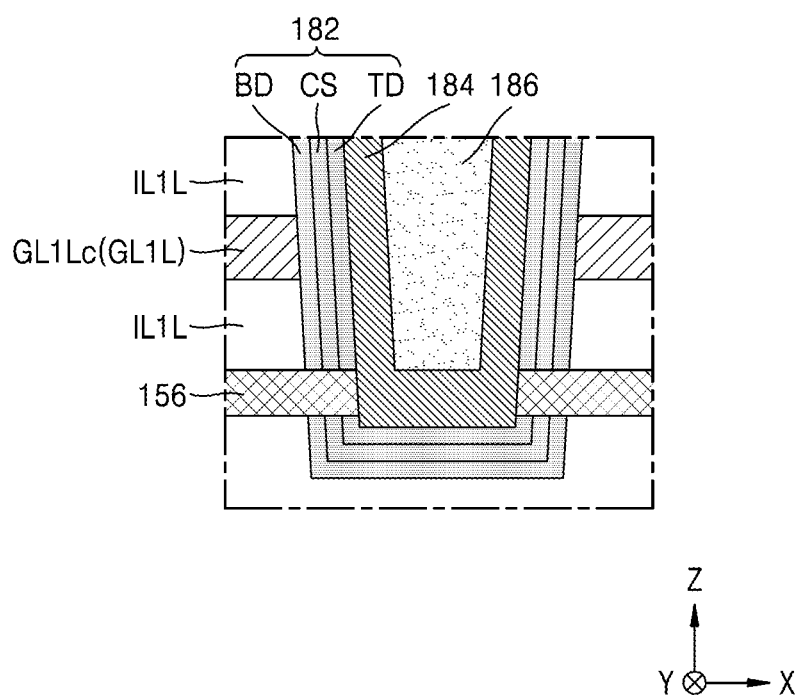
FIG. 11 is an enlarged view of region B5 in FIG. 10.

FIG. 10 is a cross-sectional view of a semiconductor device 100-4 according to embodiments. FIG. 10 shows cross-sectional views respectively taken along lines A1-A1' and A2-A2' in FIG. 2. FIG. 11 is an enlarged view of region B5 in FIG. 10. Hereinafter, differences between the semiconductor device 100 illustrated in FIGS. 2 through 5 and the semiconductor device 100-4 illustrated in FIG. 10 are described.

Referring to FIGS. 10 and 11, the semiconductor device 100-4 may further include a peripheral circuit structure PC below the substrate 110. The peripheral circuit structure PC may include a peripheral circuit substrate 502, a plurality of transistors TR, a peripheral circuit wiring layer 508, and a fifth insulating layer 510.

The peripheral circuit substrate 502 may include a semiconductor material, e.g., silicon or germanium. The transistors TR may be on the peripheral circuit substrate 502. The peripheral circuit wiring layer 508 may be connected to the transistors TR. The peripheral circuit wiring layer 508 may include a conductive material, e.g., tungsten (W), copper (Cu), molybdenum (Mo), titanium (Ti), cobalt (Co), tantalum (Ta), nickel (Ni), or a combination thereof. The fifth insulating layer 510 may be on the peripheral circuit substrate 502 and surround the peripheral circuit wiring layer 508 and the transistors TR. The fifth insulating layer 510 may include, e.g., silicon oxide, silicon nitride, or a low-k dielectric.

The semiconductor device 100-4 may further include a peripheral contact structure PTS5. The peripheral contact structure PTS5 may pass through the fifth insulating layer 510, the first insulating layer 116, the second insulating layer 114, and the third insulating layer 193 and extend from the peripheral circuit wiring layer 508 to a peripheral wiring layer PML. The peripheral circuit wiring layer 508 may be surrounded by the fifth insulating layer 510.

The semiconductor device 100-4 may include a common source line plate 156, instead of the common source line CSL in FIG. 2, between the substrate 110 and the first stack structure SS1. The common source line plate 156 may function as the common source line CSL in FIG. 1B. The common source line plate 156 may include, e.g., polysilicon, metal, or a combination thereof. As shown in FIG. 11, the common source line plate 156 may pass through the gate dielectric layer 182 and be in direct contact with the channel layer 184.

Although it is illustrated in FIG. 10 that the peripheral circuit structure PC is below the substrate 110, the peripheral circuit structure PC may be on a memory cell structure (e.g., a portion of the semiconductor device 100-4 excluding the peripheral circuit structure PC) in some embodiments. Each of the peripheral circuit structure PC and the memory cell structure may include a plurality of bonding pads. The bonding pads of the peripheral circuit structure PC may be respectively electrically connected to the bonding pads of the memory cell structure. In some embodiments, the bonding pads of the peripheral circuit structure PC may be respectively in direct contact with the bonding pads of the memory cell structure.

Figure 12:
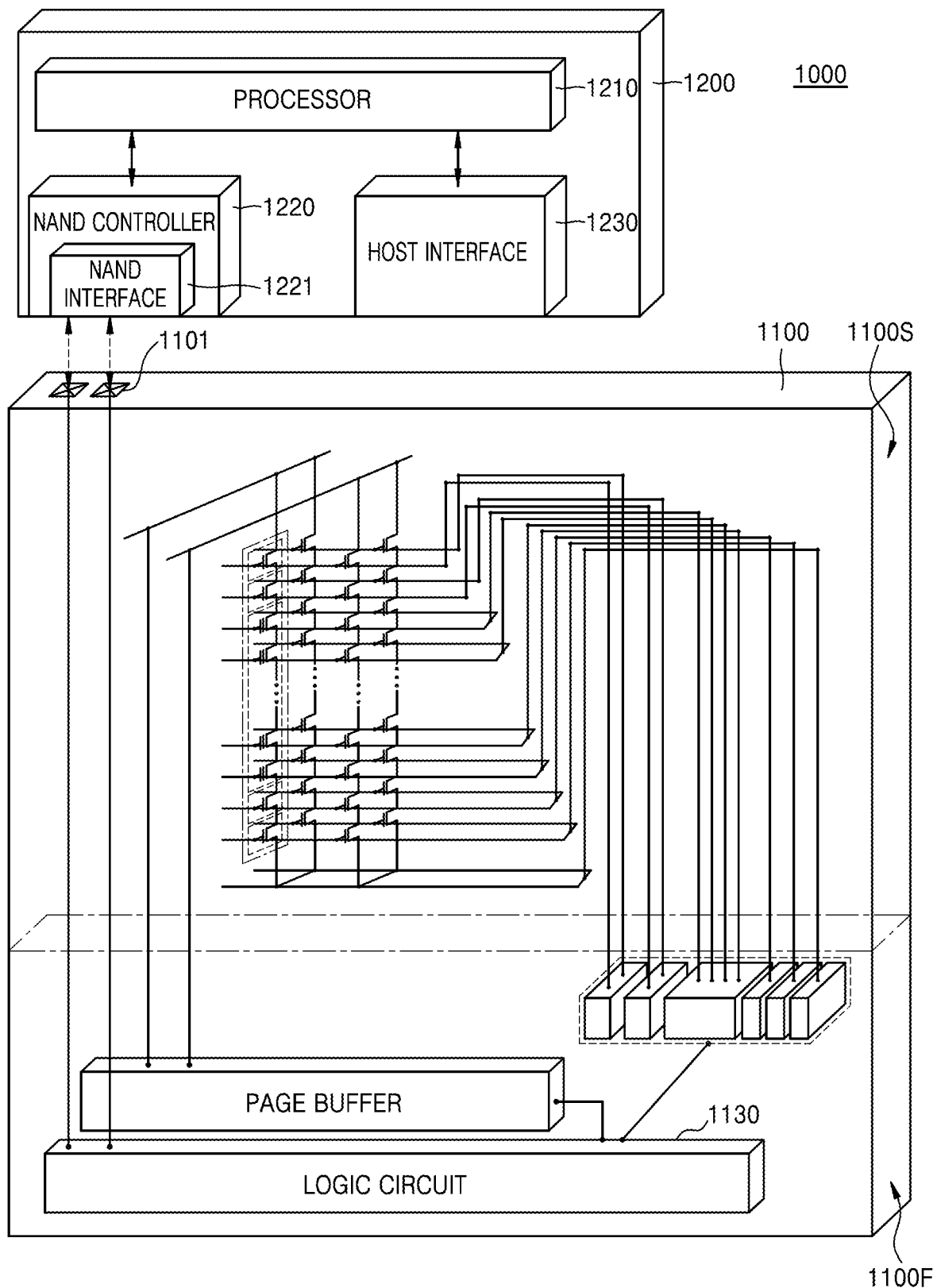
FIG. 12 is a schematic diagram of an electronic system including a semiconductor device, according to embodiments.

FIG. 12 is a schematic diagram of an electronic system 1000 including a semiconductor device 1100, according to embodiments.

Referring to FIG. 12, the electronic system 1000 may include the semiconductor device 1100 and a controller 1200 electrically connected to the semiconductor device 1100. The electronic system 1000 may correspond to a storage device including one or more semiconductor devices 1100 or an electronic device including the storage device. For example, the electronic system 1000 may include a solid state drive (SSD) device, which includes at least one semiconductor device 1100, a universal serial bus (USB), a computing system, a medical device, or a communication device.

The semiconductor device 1100 may include a flash memory device. For example, the semiconductor device 1100 may include at least one of the semiconductor devices 100, 100-1, 100-2, 100-3a through 100-3g, and 100-4 described with reference to FIGS. 2 through 11. The semiconductor device 1100 may include a memory cell array 1100S and a peripheral circuit 1100F. The semiconductor device 1100 may communicate with the controller 1200 through an I/O pad 1101, which is electrically connected to a logic circuit 1130 of the peripheral circuit 1100F.

The controller 1200 may include a processor 1210, a NAND controller 1220, and a host interface 1230. According to embodiments, the electronic system 1000 may include a plurality of semiconductor devices 1100. In this case, the controller 1200 may control the semiconductor devices 1100.

The processor 1210 may generally control the operations of the electronic system 1000 including the controller 1200. The processor 1210 may operate according to certain firmware and control the NAND controller 1220 to access the semiconductor device 1100. The NAND controller 1220 may include a NAND interface 1221 for communication with the semiconductor device 1100. A control command for controlling the semiconductor device 1100, data to be written to the semiconductor device 1100, data read from the semiconductor device 1100, or the like may be transmitted through the NAND interface 1221. The host interface 1230 may provide communication between the electronic system 1000 and an external host. When receiving a control command from an external host through the host interface 1230, the processor 1210 may control the semiconductor device 1100 in response to the control command.

Figure 13:
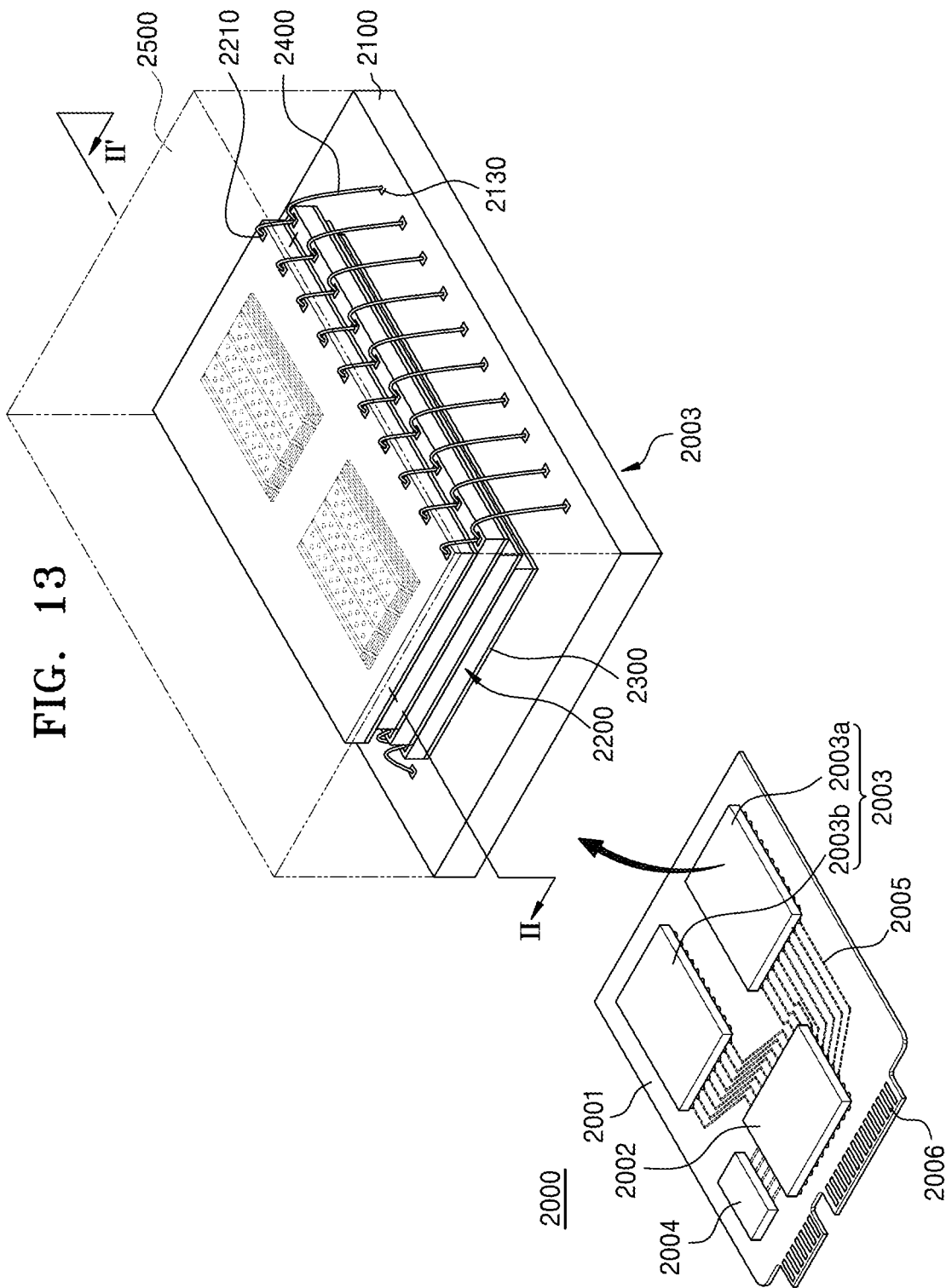
FIG. 13 is a schematic diagram of an electronic system including a semiconductor device, according to embodiments.

FIG. 13 is a schematic diagram of an electronic system 2000 including a semiconductor device, according to embodiments.

Referring to FIG. 13, the electronic system 2000 may include a main substrate 2001, a controller 2002 mounted on the main substrate 2001, at least one semiconductor package 2003, and a dynamic random access memory (DRAM) 2004. The semiconductor package 2003 and the DRAM 2004 may be connected to the controller 2002 through a plurality of wiring patterns 2005 formed in the main substrate 2001.

The main substrate 2001 may include a connector 2006, which includes a plurality of pins coupled to an external host. The number and arrangement of pins in the connector 2006 may vary with a communication interface between the electronic system 2000 and the external host. In example embodiments, the electronic system 2000 may communicate with an external host according to an interface, e.g., a USB interface, a peripheral component interconnect express (PCI-express) interface, a serial advanced technology attachment (SATA) interface, or M-PHY for universal flash storage (UFS). In example embodiments, the electronic system 2000 may be driven by power supplied from an external host through the connector 2006. The electronic system 2000 may further include a power management integrated circuit (PMIC), which distributes the power from the external host to the controller 2002 and the semiconductor package 2003. The controller 2002 may write data to or read data from the semiconductor package 2003 and improve the operating speed of the electronic system 2000.

The DRAM 2004 may correspond to a buffer memory that decreases the speed difference between an external host and the semiconductor package 2003 including data storage space. The DRAM 2004 of the electronic system 2000 may operate as a sort of cache memory and provide space for temporarily storing data during a control operation on the semiconductor package 2003. When the DRAM 2004 is included in the electronic system 2000, the controller 2002 may further include a DRAM controller that controls the DRAM 2004 in addition to a NAND controller that controls the semiconductor package 2003.

The semiconductor package 2003 may include first and second semiconductor packages 2003a and 2003b, which are separate from each other. Each of the first and second semiconductor packages 2003a and 2003b may include a plurality of semiconductor chips 2200. Each of the first and second semiconductor packages 2003a and 2003b may include a package substrate 2100, the semiconductor chips 2200 on the package substrate 2100, an adhesive layer 2300 below each of the semiconductor chips 2200, a connection structure 2400 electrically connecting the semiconductor chips 2200 to the package substrate 2100, and a molding layer 2500, which is on the package substrate 2100 and covers the semiconductor chips 2200 and the connection structure 2400.

The package substrate 2100 may include a printed circuit board including a plurality of package upper pads 2130. Each of the semiconductor chips 2200 may include an I/O pad 2210. The I/O pad 2210 may correspond to the I/O pad 1101 in FIG. 12. Each of the semiconductor chips 2200 may include at least one of the semiconductor devices 100, 100-1, 100-2, 100-3a through 100-3g, and 100-4 described with reference to FIGS. 2 through 11.

In example embodiments, the connection structure 2400 may include a bonding wire electrically connecting the I/O pad 2210 to a package upper pad 2130. Accordingly, in the first and second semiconductor packages 2003a and 2003b, the semiconductor chips 2200 may be electrically connected to each other using a bonding wire and electrically connected to the package upper pad 2130 of the package substrate 2100. According to embodiments, in the first and second semiconductor packages 2003a and 2003b, the semiconductor chips 2200 may be electrically connected to each other through a connection structure including a through silicon via (TSV), instead of the connection structure 2400 including a bonding wire.

In example embodiments, the controller 2002 and the semiconductor chips 2200 may be included in a single package. In an example embodiment, the controller 2002 and the semiconductor chips 2200 may be mounted on an interposer substrate, which is separate from the main substrate 2001, and connected to each other through a wiring formed in the interposer substrate.

Figure 14:
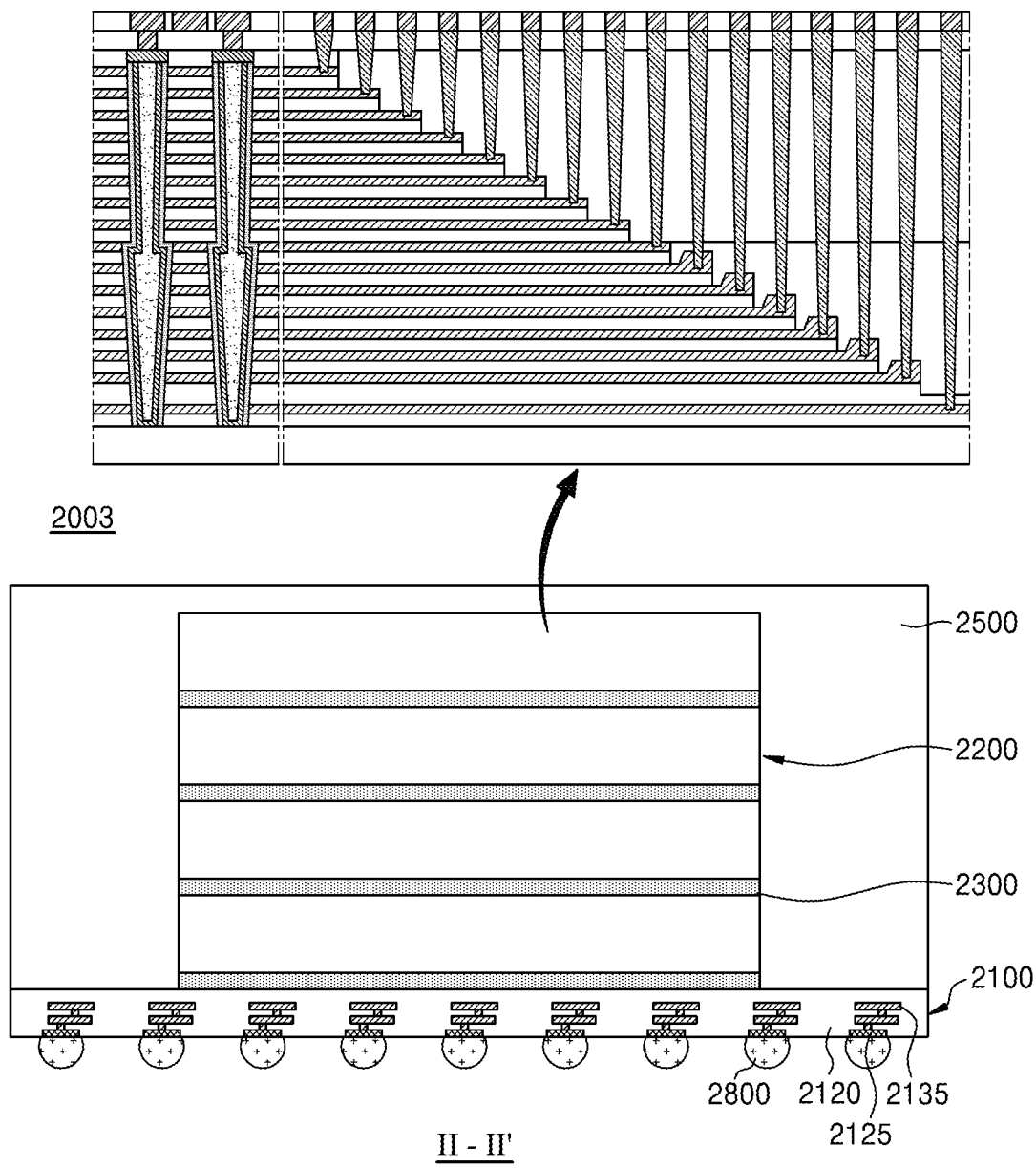
FIG. 14 is a cross-sectional view of a semiconductor package including a semiconductor device, taken along line II-II' in FIG. 13, according to embodiments.

FIG. 14 is a cross-sectional view of the semiconductor package 2003 including a semiconductor device, taken along line II-II' in FIG. 13, according to embodiments.

Referring to FIG. 14, the package substrate 2100 of the semiconductor package 2003 may include a printed circuit board. The package substrate 2100 may include a package substrate body 2120, a plurality of package upper pads 2130 (see FIG. 13) on the top surface of the package substrate body 2120, a plurality of lower pads 2125 arranged in or exposed through the bottom surface of the package substrate body 2120, and a plurality of internal wirings 2135 which are arranged in the package substrate body 2120 to electrically connect the package upper pads 2130 to the lower pads 2125. The lower pads 2125 may be connected to the wiring patterns 2005 on the main substrate 2001 of the electronic system 2000 of FIG. 13 through a plurality of conductive connectors 2800. Each of the semiconductor chips 2200 may include at least one of the semiconductor devices 100, 100-1, 100-2, 100-3a through 100-3g, and 100-4 described with reference to FIGS. 2 through 11.

FIGS. 15A through 15K are cross-sectional views of stages in a method of manufacturing a semiconductor device, according to embodiments.

Figure 15A:
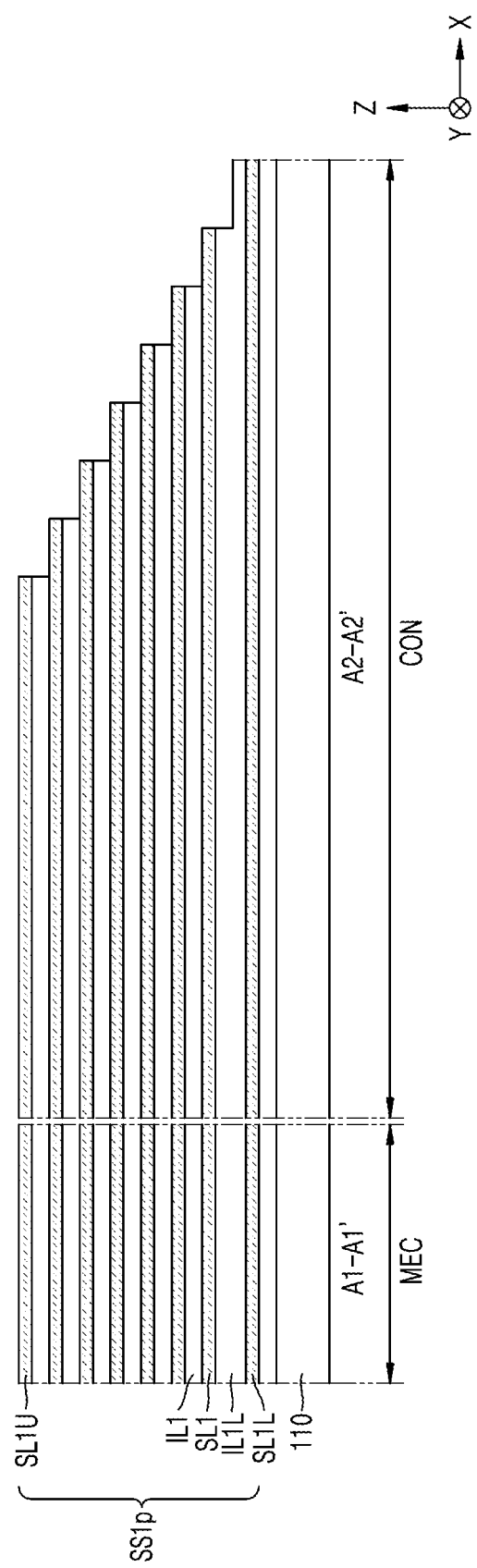
FIGS. 15A through 15K are cross-sectional views of stages in a method of manufacturing a semiconductor device, according to embodiments.

Referring to FIG. 15A, a first preliminary stack structure SS1p may be formed on the substrate 110. The first preliminary stack structure SS1p may include a plurality of first interlayer insulating layers IL1 and a plurality of first sacrificial layers SL1, which are alternately stacked on the substrate 110. A first interlayer insulating layer IL1L on a lowest first sacrificial layer SL1L among the first sacrificial layers SL1 may be thicker than the others of the first interlayer insulating layers IL1. In this case, the lowest first sacrificial layer SL1L may be completely covered with the first interlayer insulating layer IL1L. In an embodiment, the first interlayer insulating layers IL1 may have the same thickness as each other. The first sacrificial layers SL1 may include a material, which has an etch selectivity with respect to the first interlayer insulating layers IL1. For example, the first interlayer insulating layers IL1 may include silicon oxide, and the first sacrificial layers SL1 may include silicon nitride.

Thereafter, a portion of the first preliminary stack structure SS1p on the connection region CON of the substrate 110 may be patterned into a step shape.

Figure 15B:
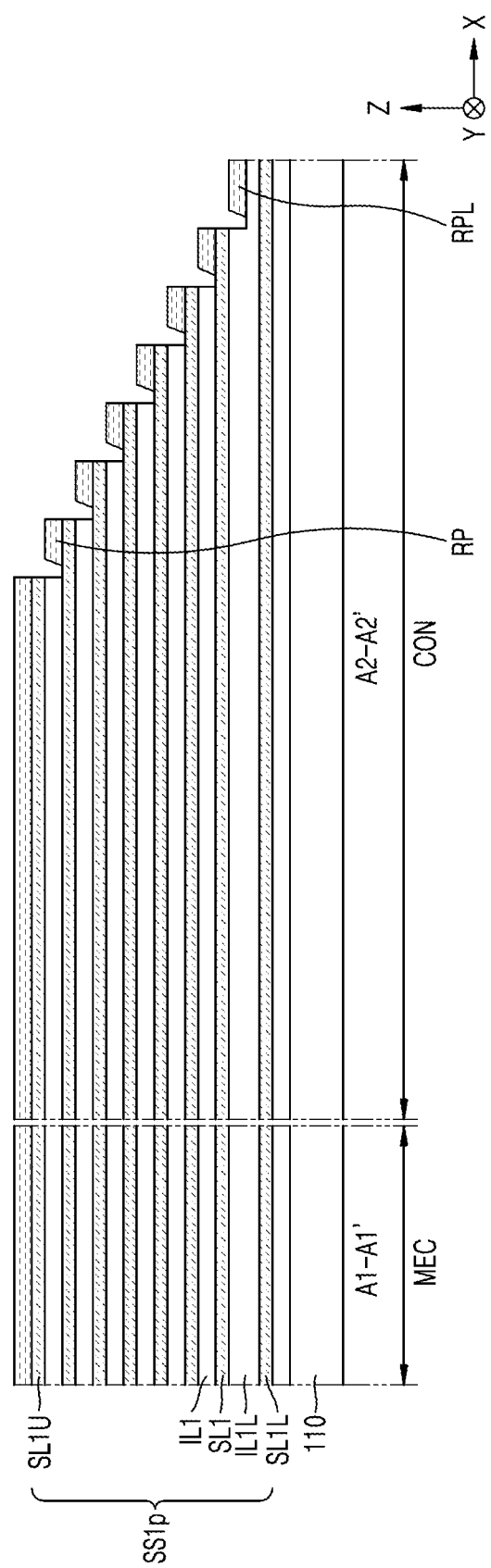

Referring to FIG. 15B, a sacrificial pattern RP may be formed, e.g., directly, on a step-shaped portion of each of the first sacrificial layers SL1. However, when the lowest first sacrificial layer SL1L is completely covered with the first interlayer insulating layer IL1L, a lowest sacrificial pattern RPL among a plurality of sacrificial patterns RP may be formed not directly on the lowest first sacrificial layer SL1L but on, e.g., a portion of, the first interlayer insulating layer IL1L that is thick. For example, the sacrificial patterns RP may include silicon nitride.

For example, an additional sacrificial layer may be formed on the first preliminary stack structure SS1p under the condition that the additional sacrificial layer has a low step coverage. The additional sacrificial layer may be formed on the first interlayer insulating layers IL1 and the first sacrificial layers SL1. Thereafter, a portion of the additional sacrificial layer on a side wall of each of the first interlayer insulating layers IL1 is removed such that the sacrificial patterns RP are separate from each other. For example, the sacrificial patterns RP may include silicon nitride.

Figure 15C:
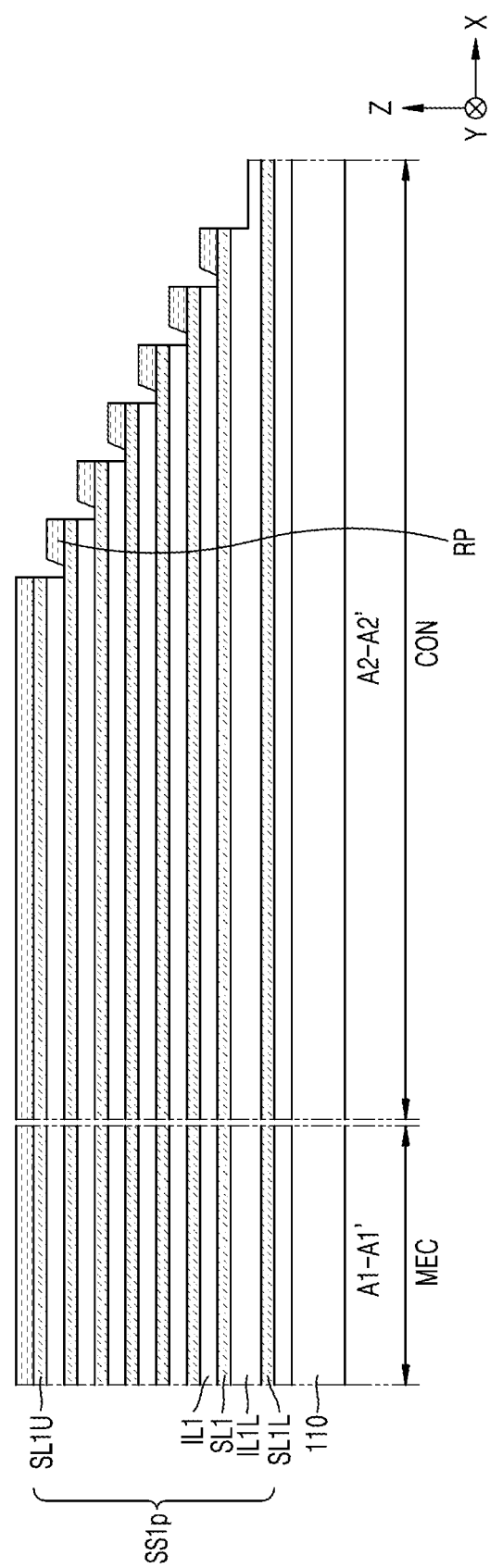

Referring to FIG. 15C, the lowest sacrificial pattern RPL may be removed. For example, a photoresist layer, which exposes the lowest sacrificial pattern RPL and partially covers the first preliminary stack structure SS1p, may be formed. The lowest sacrificial pattern RPL may be removed. Thereafter, the photoresist layer may be removed.

Figure 15D:
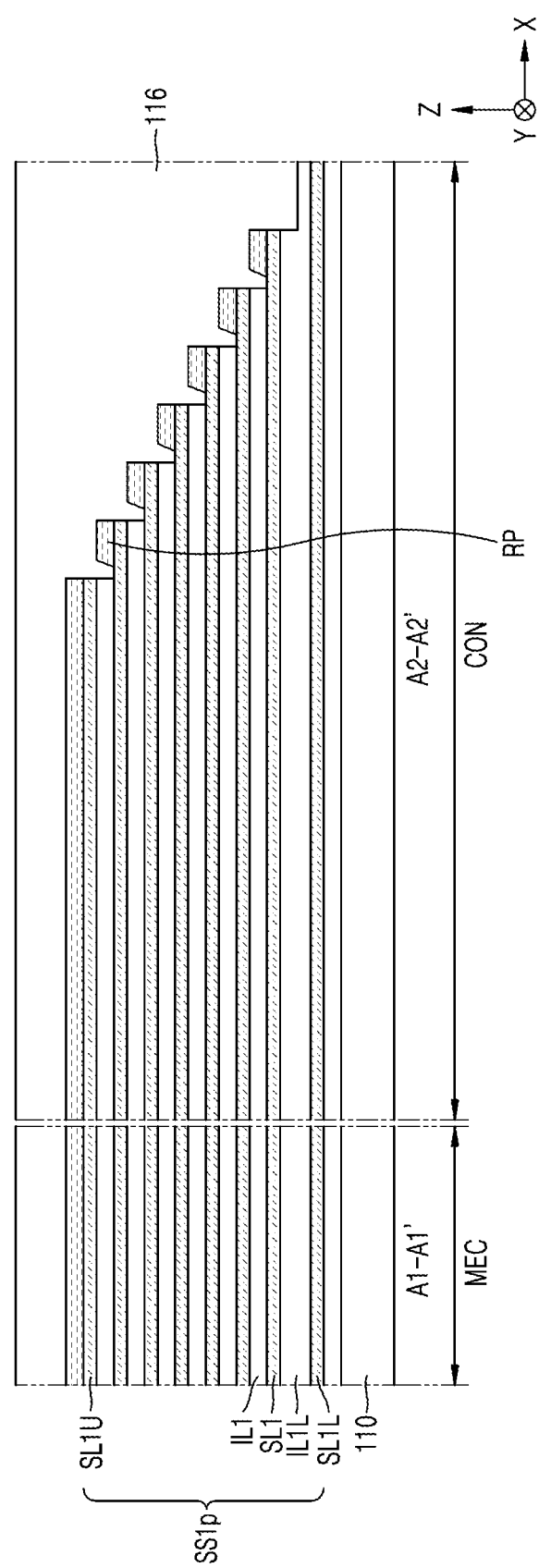

Referring to FIG. 15D, the first insulating layer 116 covering the first preliminary stack structure SS1p may be formed.

Figure 15E:
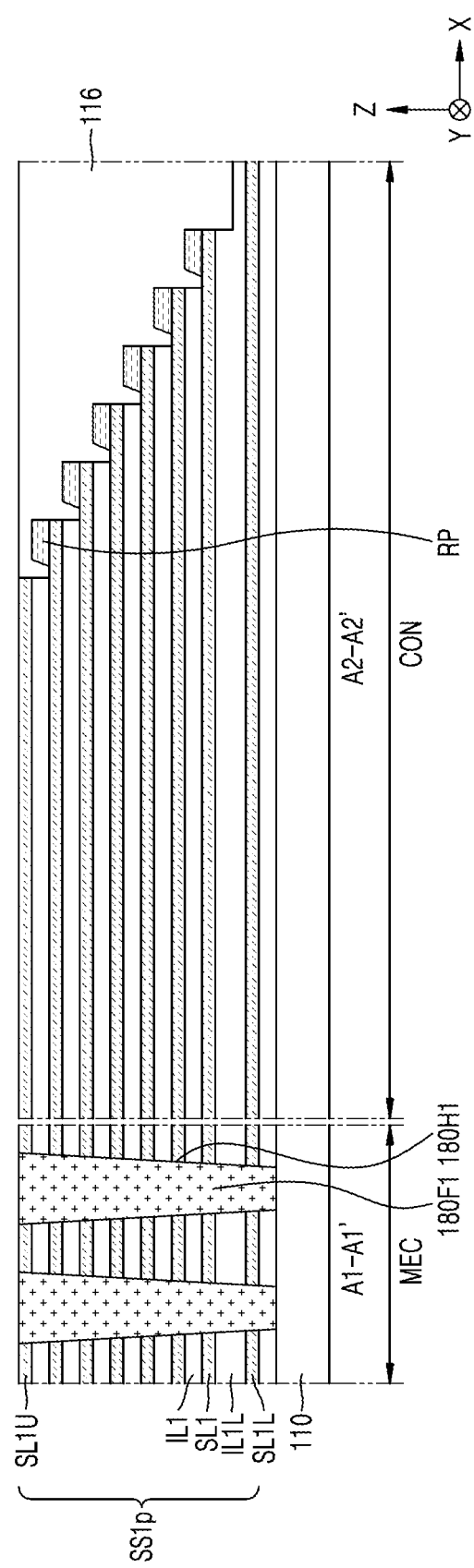

Referring to FIG. 15E, a first channel hole 180H1 passing through the first preliminary stack structure SS1p may be formed. A channel sacrificial layer 180F1 may be formed in the first channel hole 180H1 and on the first insulating layer 116. The channel sacrificial layer 180F1 and the first insulating layer 116 may be polished to expose an uppermost first sacrificial layer SL1U among the first sacrificial layers SL1. During the polishing, a sacrificial pattern RP on the uppermost first sacrificial layer SL1U may be removed.

Figure 15F:
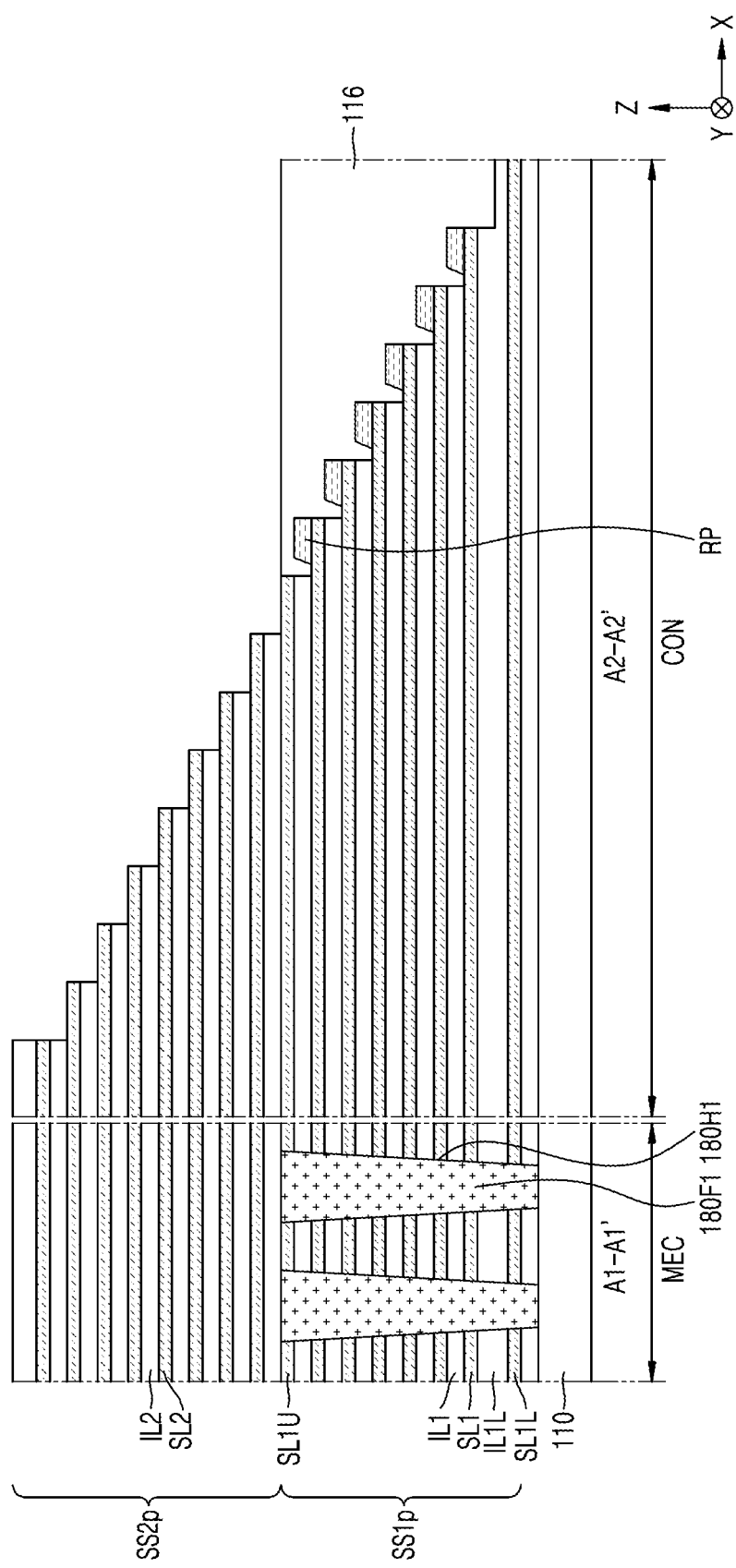

Referring to FIG. 15F, a second preliminary stack structure SS2p may be formed on the first preliminary stack structure SS1*p* and the first insulating layer 116. The second preliminary stack structure SS2*p* may include a plurality of second interlayer insulating layers IL2 and a plurality of second sacrificial layers SL2, which are alternately stacked on the substrate 110. The second sacrificial layers SL2 may include a material, which has an etch selectivity with respect to the second interlayer insulating layers IL2. For example, the second interlayer insulating layers IL2 may include silicon oxide, and the second sacrificial layers SL2 may include silicon nitride.

Thereafter, a portion of the second preliminary stack structure SS2*p* on the connection region CON of the substrate 110 may be patterned into a step shape. An operation of forming a sacrificial pattern RP (see FIG. 15B) on the second preliminary stack structure SS2*p* may be omitted. Accordingly, the cost of manufacturing processes may be reduced.

Figure 15G:
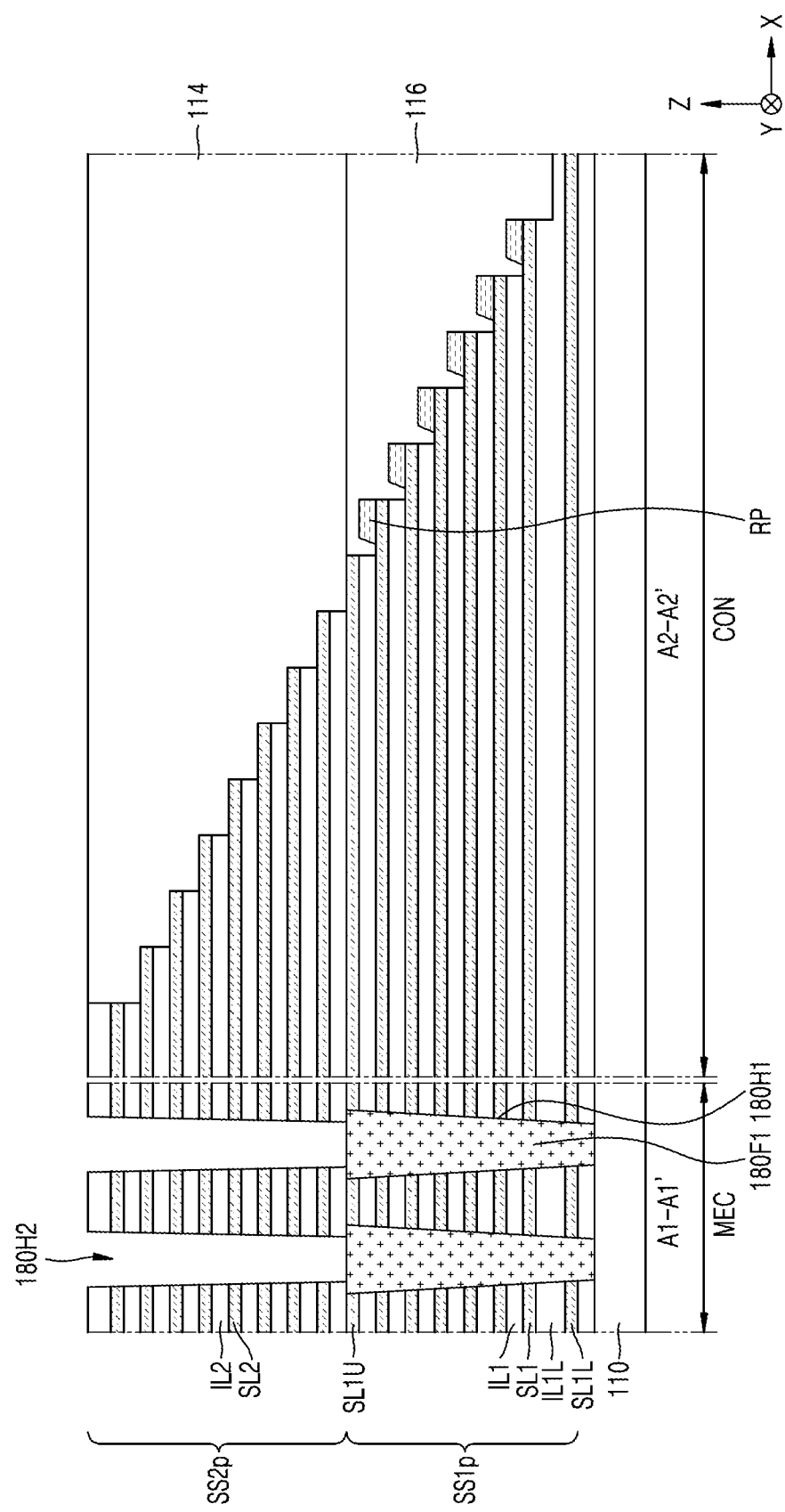

Referring to FIG. 15G, the second insulating layer 114 covering the step structure of the second preliminary stack structure SS2*p* may be formed on the first insulating layer 116. In addition, a second channel hole 180H2, which passes through the second preliminary stack structure SS2*p* and exposes the channel sacrificial layer 180F1, may be formed.

Figure 15H:
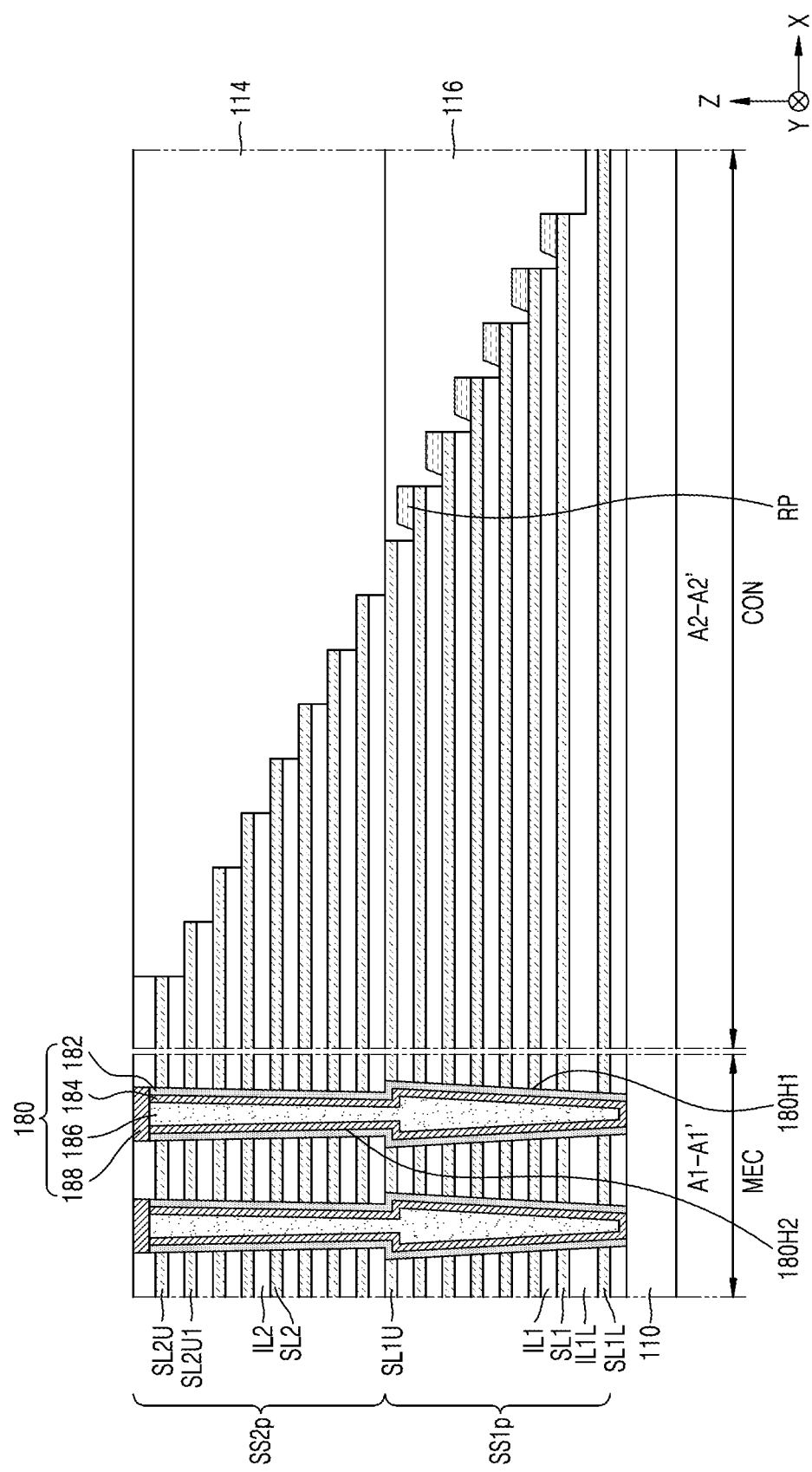

Referring to FIGS. 15G and 15H, the channel sacrificial layer 180F1 may be removed from the first channel hole 180H1. Thereafter, the channel structure 180 may be formed in the first channel hole 180H1 and the second channel hole 180H2. For example, the gate dielectric layer 182 and the channel layer 184 may be sequentially formed on the inner walls of the first channel hole 180H1 and the second channel hole 180H2. The buried insulating layer 186 may be formed in the first channel hole 180H1 and the second channel hole 180H2 to fill the remaining portions of the first and second channel holes 180H1 and 180H2. The respective top portions of the buried insulating layer 186, the channel layer 184, and the gate dielectric layer 182 may be removed, and the pad 188 may be formed in a space resulting from the removal of the top portions.

The word line cut WLC in FIG. 2 may be formed. The word line cut WLC may cut, e.g., extend continuously through, the first preliminary stack structure SS1*p* and the second preliminary stack structure SS2*p* in the vertical direction (the Z direction) and the first horizontal direction (the X direction).

Figure 15I:
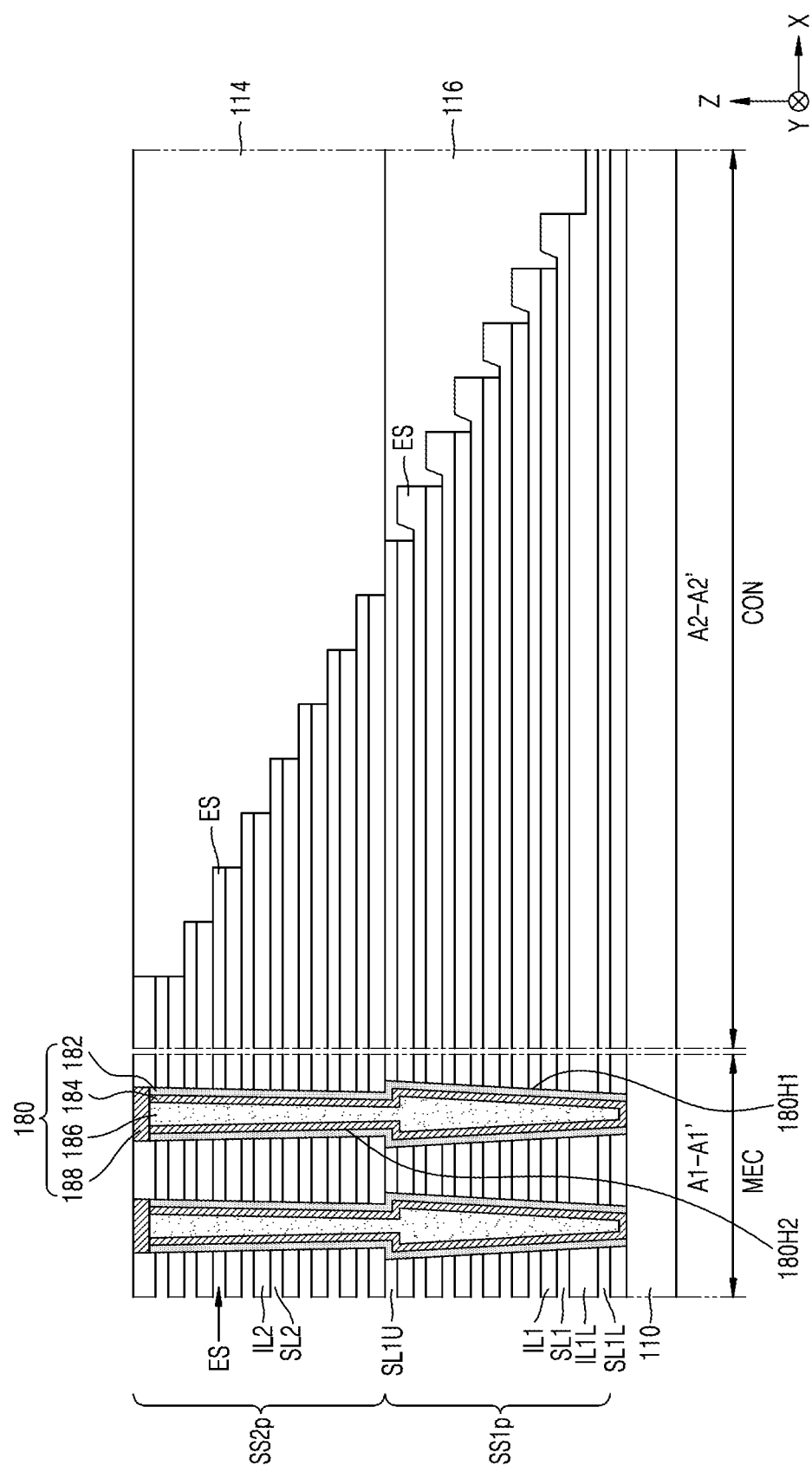

Referring to FIGS. 15H and 15I, the first sacrificial layers SL1, the second sacrificial layers SL2, and the plurality of sacrificial patterns RP may be removed by, e.g., through, the word line cut WLC. In other words, a space ES (previously occupied by the first sacrificial layers SL1, the second sacrificial layers SL2, and the sacrificial patterns RP) may be emptied, e.g., defined by removal of the sacrificial layers. For example, referring to FIG. 15I, the space ES may include large empty spaces (e.g., cavities extending into the first insulating layer 116) above edges of the first interlayer insulating layers IL1 in the connection region CON (instead of the removed sacrificial patterns RP) defined by the first insulating layer 116.

Figure 15J:
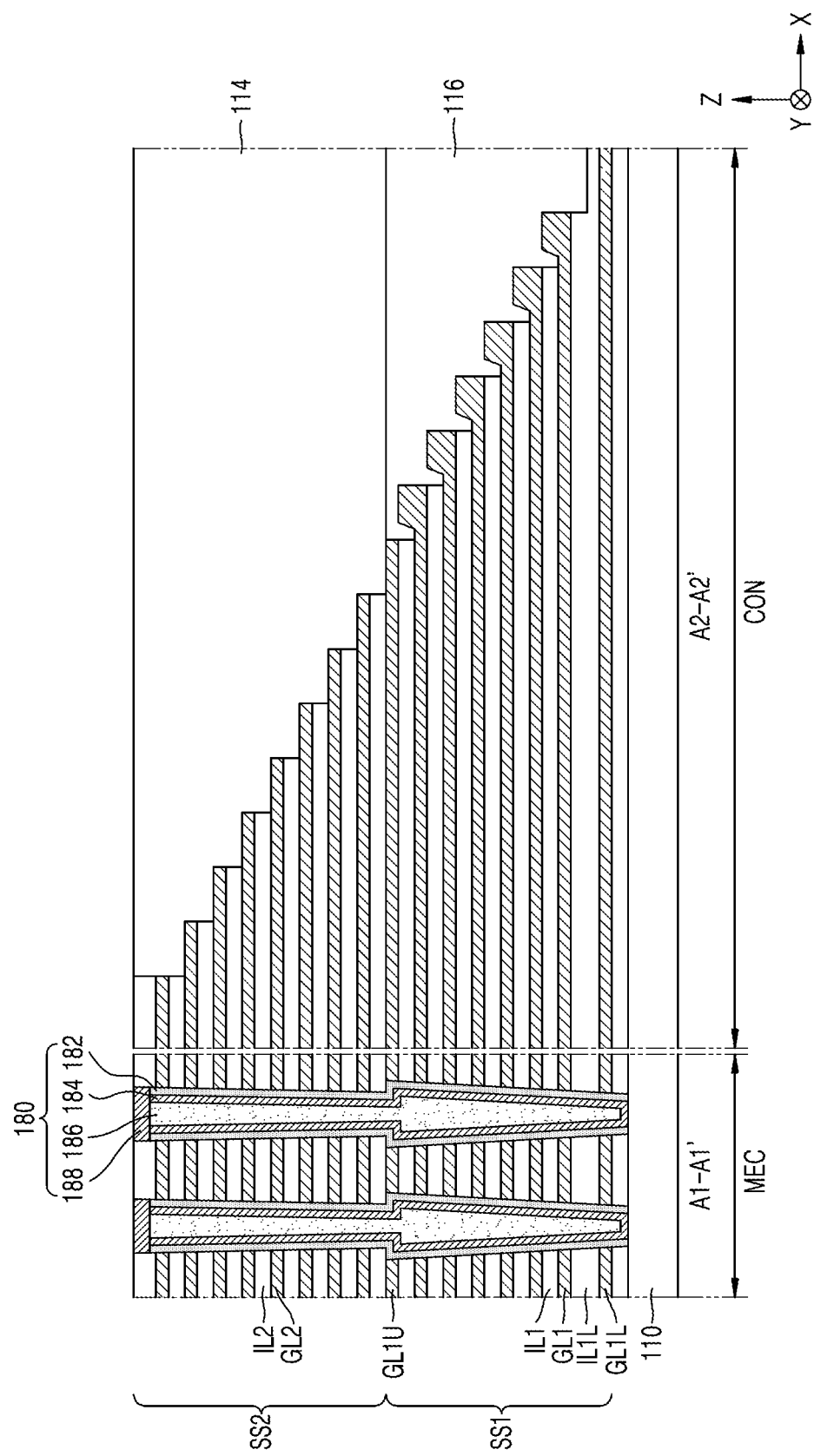

Referring to FIGS. 15I through 15J, the plurality of first gate layers GL1 and the plurality of second gate layers GL2 may be formed in the space ES that has been previously occupied by the first sacrificial layers SL1, the second sacrificial layers SL2, and the sacrificial patterns RP. Consequently, the first stack structure SS1 may be formed from the first preliminary stack structure SS1*p*, and the second stack structure SS2 may be formed from the second preliminary stack structure SS2*p*. Because of the space that has been occupied by the sacrificial patterns RP, the first gate layers GL1, except for the uppermost first gate layer GL1U and the lowest first gate layer GL1L, may have a shape in which an end portion is thicker than a central portion. For example, referring to FIG. 15J, since the space ES may include larger empty spaces above edges of the first interlayer insulating layers IL1 in the connection region CON, portions of the first gate layers GL1 formed in such larger cavities may be thicker than central portions of the first gate layers GL1.

Referring to FIG. 2, the insulating spacer 192 and the common source line CSL may be formed in the word line cut WLC.

Figure 15K:
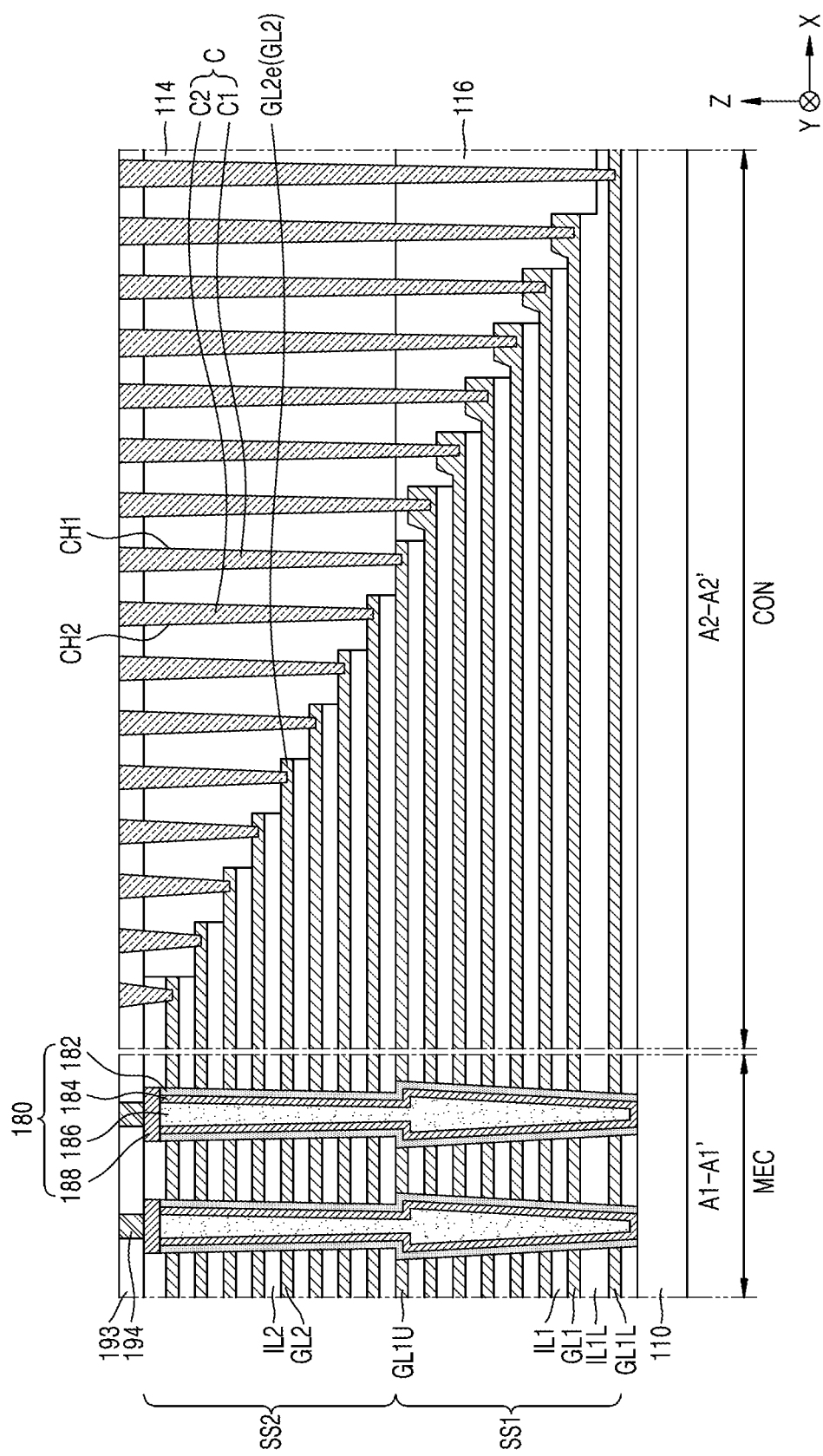

Referring to FIG. 15K, the third insulating layer 193 may be formed on the second stack structure SS2 and the second insulating layer 114. A bit line contact pad 194, which passes through the third insulating layer 193 and is in contact with the channel structure 180, may be formed.

A first contact hole CH1 and a second contact hole CH2 may be simultaneously formed. The first contact hole CH1 may pass through the first insulating layer 116, the second insulating layer 114, and the third insulating layer 193 and expose an end portion of each of the first gate layers GL1. The second contact hole CH2 may pass through the second insulating layer 114 and the third insulating layer 193 and expose an end portion of each of the second gate layers GL2. An etch depth of the first contact hole CH1 may be greater than that of the second contact hole CH2, but an etching by-product preventing the over etch is less deposited in the first contact hole CH1 than in the second contact hole CH2, and accordingly, the likelihood of punching-through failure of the first contact hole CH1 may be relatively high compared to the second contact hole CH2. However, because each of the first gate layers GL1 has a shape in which an end portion is thicker than a central portion, the likelihood of punching-through failure of the first contact hole CH1 may be decreased due to the thick end portion of each first gate layer GL1. As a result, the yield of manufacturing processes may be increased.

Thereafter, the first contact C1 may be formed in the first contact hole CH1, and the second contact C2 may be formed in the second contact hole CH2.

Referring to FIG. 3, the fourth insulating layer 195 may be formed on the third insulating layer 193. The bit line BL contacting the bit line contact pad 194 and the wiring layer ML contacting the first contact C1 or the second contact C2 may be formed. As such, the semiconductor device 100 described above with reference to FIGS. 2 through 5 may be manufactured.

Although the method of manufacturing the semiconductor device 100 described above with reference to FIGS. 2 through 5 is described with reference to FIGS. 15A through 15K, the semiconductor devices 100-1, 100-2, 100-3*a* through 100-3*g*, and 100-4 described above with reference to FIGS. 6 through 11 may be manufactured in a similar method.

By way of summation and review, embodiments provide a 3D flash memory semiconductor device for increasing the yield of manufacturing processes and saving the cost of manufacturing processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a cell region and a connection region;
   a first stack structure including first gate layers and first interlayer insulating layers, the first gate layers being stacked on the substrate alternately with the first interlayer insulating layers one by one in a vertical direction; and
   a second stack structure including second gate layers and second interlayer insulating layers, the second gate layers being stacked on the first stack structure alternately with the second interlayer insulating layers one by one in the vertical direction,
   wherein each of the first gate layers includes a central portion in the cell region of the substrate and an end portion in the connection region of the substrate,
   wherein each of the second gate layers includes a central portion in the cell region of the substrate and an end portion in the connection region of the substrate, and
   wherein a first difference between a thickness in the vertical direction of the end portion of each of at least two of the first gate layers and a thickness in the vertical direction of the central portion of each of the at least two of the first gate layers is different from a second difference between a thickness in the vertical direction of the end portion of each of at least two of the second gate layers and a thickness in the vertical direction of the central portion of each of the at least two of the second gate layers.

2. The semiconductor device as claimed in claim 1, wherein the first difference is greater than the second difference.

3. The semiconductor device as claimed in claim 2, further comprising:
   first contacts extending in the vertical direction and being respectively in contact with the first gate layers; and
   second contacts extending in the vertical direction and being respectively in contact with the second gate layers,
   wherein an average of depths, by which the first contacts are respectively recessed into the first gate layers in the vertical direction, is greater than an average of depths, by which the second contacts are respectively recessed into the second gate layers in the vertical direction.

4. The semiconductor device as claimed in claim 2, further comprising:
   first contacts extending in the vertical direction and being respectively in contact with the first gate layers; and
   second contacts extending in the vertical direction and being respectively in contact with the second gate layers,
   wherein a maximum among depths, by which the first contacts are respectively recessed into the first gate layers in the vertical direction, is greater than a thickness of the central portion of each of the first gate layers.

5. The semiconductor device as claimed in claim 2, wherein the thickness of the end portion of each of the at least two of the first gate layers is greater in the vertical direction than the thickness of the central portion of each of the at least two of the first gate layers.

6. The semiconductor device as claimed in claim 5, wherein the thickness of the end portion of each of the at least two of the second gate layers is, in the vertical direction, equal to the thickness of the central portion of each of the at least two of the second gate layers.

7. The semiconductor device as claimed in claim 5, wherein the thickness of the end portion of each of the at least two of the second gate layers is greater in the vertical direction than the thickness of the central portion of each of the at least two of the second gate layers.

8. The semiconductor device as claimed in claim 5, wherein the thickness of the end portion of each of at least one of a lowest gate layer and an uppermost gate layer among the first gate layers is, in the vertical direction, equal to the thickness of the central portion of each of the at least one of the lowest gate layer and the uppermost gate layer among the first gate layers.

9. The semiconductor device as claimed in claim 1, wherein the first difference is less than the second difference.

10. The semiconductor device as claimed in claim 1, further comprising a channel structure passing through the first stack structure and the second stack structure in the vertical direction,
    wherein the channel structure includes a first portion and a second portion, the first portion passing through the first stack structure, and the second portion passing through the second stack structure, and
    wherein a diameter of a top of the first portion of the channel structure is greater than a diameter of a bottom of the second portion of the channel structure.

11. A semiconductor device, comprising:
    a substrate;
    stack structures stacked on the substrate in a vertical direction;
    a channel structure passing through the stack structures in the vertical direction; and
    contacts extending in the vertical direction and being in contact with the stack structures,
    wherein the stack structures include at least one first-type stack structure and at least one second-type stack structure,
    wherein the at least one first-type stack structure includes first gate layers and first interlayer insulating layers, the first gate layers being stacked alternately with the first interlayer insulating layers one by one in the vertical direction,
    wherein the at least one second-type stack structure includes second gate layers and second interlayer insulating layers, the second gate layers being stacked alternately with the second interlayer insulating layers one by one in the vertical direction,
    wherein each of the first gate layers includes a first shaped gate layer having a first shape and including a central portion and an end portion, the central portion of the first shaped gate layer being adjacent to the channel structure, the end portion of the first shaped gate layer being adjacent to one of the contacts that is in contact with the first shaped gate layer, and a thickness of the end portion of the first shaped gate layer being greater in the vertical direction than a thickness of the central portion of the first shaped gate layer, and
    wherein each of the second gate layers includes a second shaped gate layer having a second shape and including a central portion and an end portion, the central portion of the second shaped gate layer being adjacent to the channel structure, the end portion of the second shaped gate layer being adjacent to one of the contacts that is in contact with the second shaped gate layer, and a thickness of the end portion of the second shaped gate layer being, in the vertical direction, equal to a thickness of the central portion of the second shaped gate layer.

12. The semiconductor device as claimed in claim 11, wherein the thickness of the end portion of the second shaped gate layer is less in the vertical direction than the thickness of the end portion of the first shaped gate layer.

13. The semiconductor device as claimed in claim 11, wherein an uppermost stack structure among the stack structures is one of the at least one second-type stack structure.

14. The semiconductor device as claimed in claim 11, wherein an intermediate stack structure among the stack structures is one of the at least one first-type stack structure, the intermediate stack structure being between an uppermost stack structure among the stack structures and a lowest stack structure among the stack structures.

15. The semiconductor device as claimed in claim 11, wherein at least one of a lowest gate layer and an uppermost gate layer among the first gate layers has the second shape.

16. An electronic system, comprising:
a semiconductor device; and
a controller electrically connected to the semiconductor device,
wherein the semiconductor device includes:
    a peripheral circuit structure;
    a substrate on the peripheral circuit structure;
    a common source line plate on the substrate;
    a first stack structure including first gate layers and first interlayer insulating layers, the first gate layers being stacked on the common source line plate alternately with the first interlayer insulating layers one by one in a vertical direction;
    a second stack structure including second gate layers and second interlayer insulating layers, the second gate layers being stacked on the first stack structure alternately with the second interlayer insulating layers one by one in the vertical direction;
    a channel structure passing through the common source line plate, the first stack structure, and the second stack structure in the vertical direction;
    first contacts extending in the vertical direction and being respectively in contact with the first gate layers; and
    second contacts extending in the vertical direction and being respectively in contact with the second gate layers,
wherein each of the first gate layers includes a central portion and an end portion, the central portion of each of the first gate layers being adjacent to the channel structure, and the end portion of each of the first gate layers being adjacent to one of the first contacts respectively contacting the respective one of the first gate layers,
wherein a thickness of the end portion of each of the first gate layers is greater in the vertical direction than a thickness of the central portion of each of the first gate layers,
wherein each of the second gate layers includes a central portion and an end portion, the central portion of each of the second gate layers being adjacent to the channel structure, and the end portion of each of the second gate layers being adjacent to one of the first contacts respectively contacting the respective one of the second gate layers, and
wherein a thickness of the end portion of each of the second gate layers is less in the vertical direction than the thickness of the end portion of each of the first gate layers.

17. The electronic system as claimed in claim 16, wherein the thickness of the end portion of each of the second gate layers is, in the vertical direction, equal to a thickness of the central portion of each of the second gate layers.

18. The electronic system as claimed in claim 16, wherein:
the thickness of the end portion of each of the second gate layers is greater in the vertical direction than a thickness of the central portion of each of the second gate layers, and
a difference between the thickness of the end portion of each of the second gate layers and the thickness of the central portion of each of the second gate layers is less than a difference between the thickness of the end portion of each of the at least one of the first gate layers and the thickness of the central portion of each of the at least one of the first gate layers.

19. The electronic system as claimed in claim 16, further comprising:
a third stack structure between the substrate and the first stack structure or between the first stack structure and the second stack structure, the third stack structure including third gate layers and third interlayer insulating layers stacked alternately with the third gate layers; and
third contacts extending in the vertical direction and being respectively in contact with the third gate layers,
wherein the channel structure further passes through the third stack structure,
wherein each of the third gate layers includes a central portion and an end portion, the central portion being adjacent to the channel structure, and the end portion being adjacent to one of the third contacts respectively contacting at least one of the third gate layers, and
wherein a thickness of the end portion of each of the third gate layers is greater in the vertical direction than a thickness of the central portion of each of the third gate layers.

20. The electronic system as claimed in claim 16, wherein each of the at least one of the first gate layers includes a base portion and a protrusion portion, the base portion extending in a horizontal direction with a constant thickness, and the protrusion portion protruding from a top surface of the base portion.

* * * * *